US012694927B2

(12) United States Patent
Wang et al.

(10) Patent No.: US 12,694,927 B2
(45) Date of Patent: Jul. 28, 2026

(54) MULTI-PORT SRAM STRUCTURES WITH CELL SIZE OPTIMIZATION

(71) Applicant: Taiwan Semiconductor Manufacturing Company, Ltd., Hsin-Chu (TW)

(72) Inventors: Ping-Wei Wang, Hsin-Chu (TW); Feng-Ming Chang, Zhubei City (TW); Jui-Lin Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 97 days.

(21) Appl. No.: 18/351,140

(22) Filed: Jul. 12, 2023

(65) Prior Publication Data

US 2024/0304240 A1 Sep. 12, 2024

Related U.S. Application Data

(60) Provisional application No. 63/489,199, filed on Mar. 9, 2023.

(51) Int. Cl.
*G11C 11/412* (2006.01)
*G11C 11/419* (2006.01)
*H10B 10/00* (2023.01)

(52) U.S. Cl.
CPC .......... *G11C 11/412* (2013.01); *G11C 11/419* (2013.01); *H10B 10/12* (2023.02); *H10B 10/18* (2023.02)

(58) Field of Classification Search
CPC ..... G11C 11/419; G11C 11/412; H10B 10/18; H10B 10/12

USPC .......................................................... 365/154
See application file for complete search history.

(56) References Cited

U.S. PATENT DOCUMENTS 8,363,456 B2 * 1/2013 Nii ...................... G11C 11/4125
365/63
8,605,523 B2 12/2013 Tao et al.
8,630,132 B2 1/2014 Cheng et al.
8,760,948 B2 6/2014 Tao et al.
8,913,455 B1 * 12/2014 Camarota .......... H10D 84/0165
365/189.04
2008/0123462 A1 5/2008 Liaw
(Continued)

FOREIGN PATENT DOCUMENTS

KR 20170090986 A 8/2017
KR 20180127288 A 11/2018
(Continued)

*Primary Examiner* — Sung Il Cho
(74) *Attorney, Agent, or Firm* — HAYNES AND BOONE, LLP

(57) ABSTRACT

A memory cell includes first and second active regions extending lengthwise in a first direction, and first, second, third, and fourth gate structures arranged in order from first to fourth along the first direction. Each of the first, second, third, and fourth gate structures extends lengthwise in a second direction that is perpendicular to the first direction. The first, second, third, and fourth gate structures are configured to engage the first and second active regions in forming first, second, third, fourth, fifth, and sixth transistors of a write-port of the memory cell. The memory cell also includes a fifth gate structure configured to engage the second active region in forming a seventh transistor of a read-port of the memory cell.

20 Claims, 23 Drawing Sheets

(56)                    References Cited

U.S. PATENT DOCUMENTS

| | | | |
|---|---|---|---|
| 2011/0317477 A1 * | 12/2011 | Liaw | H10B 10/12 |
| | | | 365/156 |
| 2014/0032871 A1 | 1/2014 | Hsu et al. | |
| 2014/0153321 A1 | 6/2014 | Liaw | |
| 2014/0153322 A1 * | 6/2014 | Liaw | H10D 84/834 |
| | | | 365/156 |
| 2014/0153345 A1 | 6/2014 | Kim et al. | |
| 2014/0177352 A1 | 6/2014 | Lum | |
| 2014/0233330 A1 | 8/2014 | Ko et al. | |
| 2014/0241077 A1 | 8/2014 | Katoch et al. | |
| 2014/0269114 A1 | 9/2014 | Yang et al. | |
| 2016/0019946 A1 * | 1/2016 | Lin | G11C 11/419 |
| | | | 438/109 |
| 2020/0058656 A1 | 2/2020 | Guo | |

FOREIGN PATENT DOCUMENTS

| | | | |
|---|---|---|---|
| TW | 260789 | B | 10/1995 |
| TW | 202109529 | A | 3/2021 |

* cited by examiner

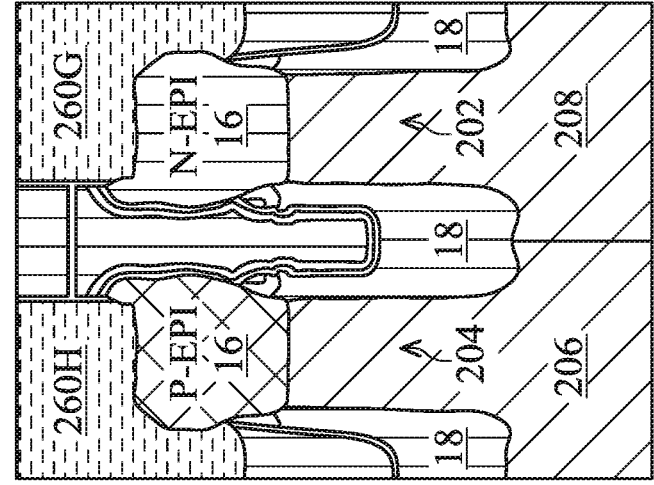
260G
260H
N-EPI
16
P-EPI
16
18
18
18
202
204
208
206
FIG. 16B
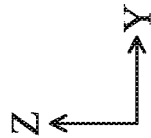
Y
Z

MULTI-PORT SRAM STRUCTURES WITH CELL SIZE OPTIMIZATION

PRIORITY DATA

This application claims priority to U.S. Provisional Patent Application No. 63/489,199 filed on Mar. 9, 2023, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Semiconductor memory is an electronic data storage device implemented on a semiconductor-based integrated circuit and has much faster access times than other types of data storage technologies. For example, static random-access memories (SRAM) devices are commonly used in integrated circuits. SRAM devices is popular in high-speed communication, image processing and system-on-chip (SOC) applications. A bit can be read from or written into the SRAM cell within a few nanoseconds, while access times for rotating storage such as hard disks is in the range of milliseconds.

When entering into deep sub-micron era, SRAM devices have become increasingly popular due to their lithography-friendly layout shapes of active regions, polysilicon lines, and metal layers. Among SRAM devices, multi-port SRAM devices have become popular. For example, a two-port (2P) SRAM device allows parallel operation, such as 1R (read) 1 W (write), or 2R (read) in one cycle, and therefore has higher bandwidth than a single-port SRAM. However, in the deep sub-micron era, SRAM cells are generally large, particularly for multi-port SRAM cells due to the insufficient area usage. With the advancement of process nodes, there is a need for cell size reduction in multi-port SRAM cells.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 16A and 16B illustrate cross-sectional views of portions of the SRAM array as in FIG. 14 or FIG. 15, in accordance with some embodiments of the present disclosure.

DETAILED DESCRIPTION

Figure 1A:
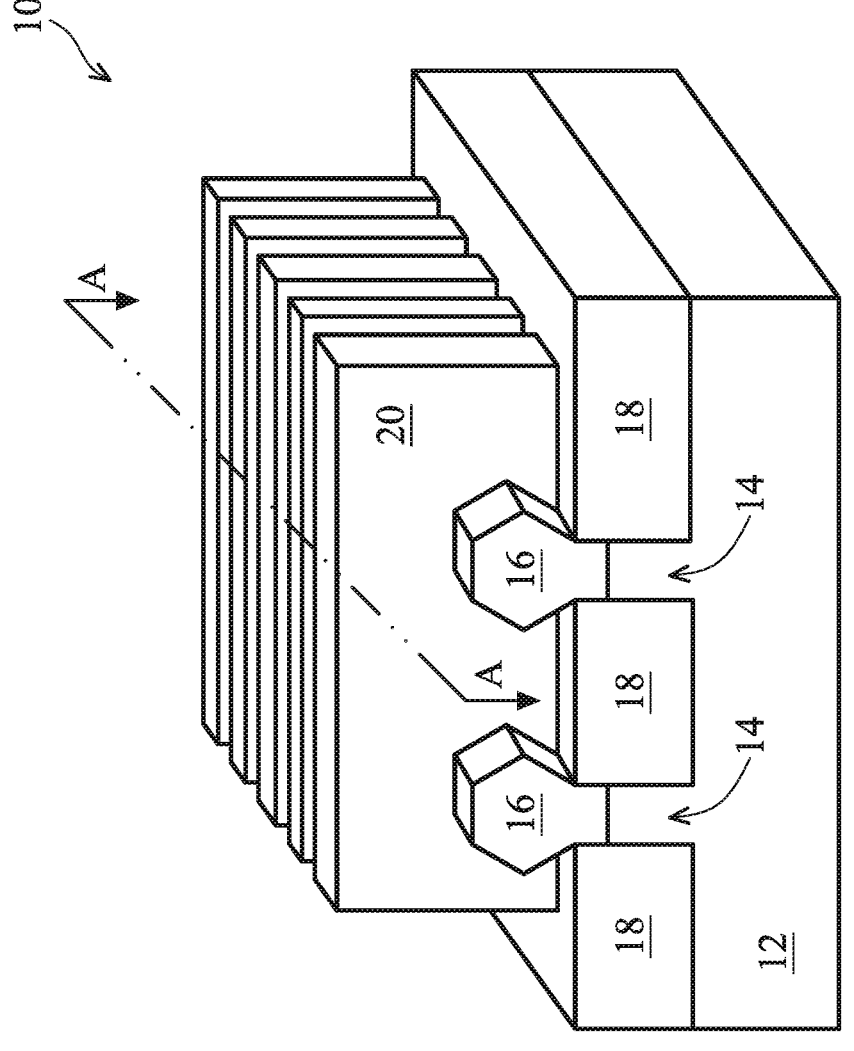
FIGS. 1A and 1B illustrate a perspective view and a top view of a portion of a memory device, respectively, in accordance with some embodiments of the present disclosure.
Figure 1A:
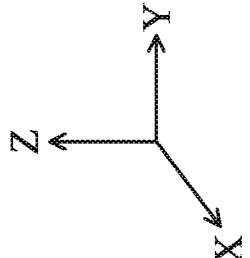

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper." "horizontal," "vertical," "above," "over," "below." "beneath," "up," "down," "top," "bottom," etc. as well as derivatives thereof (e.g., "horizontally." "downwardly."

"upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to static random-access memories (SRAM) structures, more particularly, multi-port SRAM cells. Two-port (2P) SRAM cells and the corresponding layout are provided in accordance with various exemplary embodiments. Some variations of some embodiments are discussed. Some exemplary embodiments are related to, but not otherwise limited to, multi-gate devices.

Multi-gate devices have been introduced in an effort to improve gate control by increasing gate-channel coupling, reduce OFF-state current, and reduce short-channel effects (SCEs). One such multi-gate device that has been introduced is the fin-like field-effect transistor (FinFET). The FinFET gets its name from the fin-like structure which extends from a substrate on which it is formed, and which is used to form the FET channel. Another multi-gate device, introduced in part to address performance challenges associated with the FinFET, is the gate-all-around (GAA) transistor. The GAA transistor gets its name from the gate structure which can extend around the channel region (e.g., a stack of nanosheets) providing access to the channel on four sides. The GAA transistor is compatible with conventional complementary metal-oxide-semiconductor (CMOS) processes and its structure allows it to be aggressively scaled while maintaining gate control and mitigating SCEs. The following disclosure will continue with one or more GAA examples to illustrate various embodiments of the present disclosure. It is understood, however, that the application should not be limited to a particular type of device, except as specifically claimed. For example, aspects of the present disclosure may also apply to implementation based on FinFETs or planar FETs.

The details of the device structures of the present disclosure are described in the attached drawings. The drawings have outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Figure 1B:
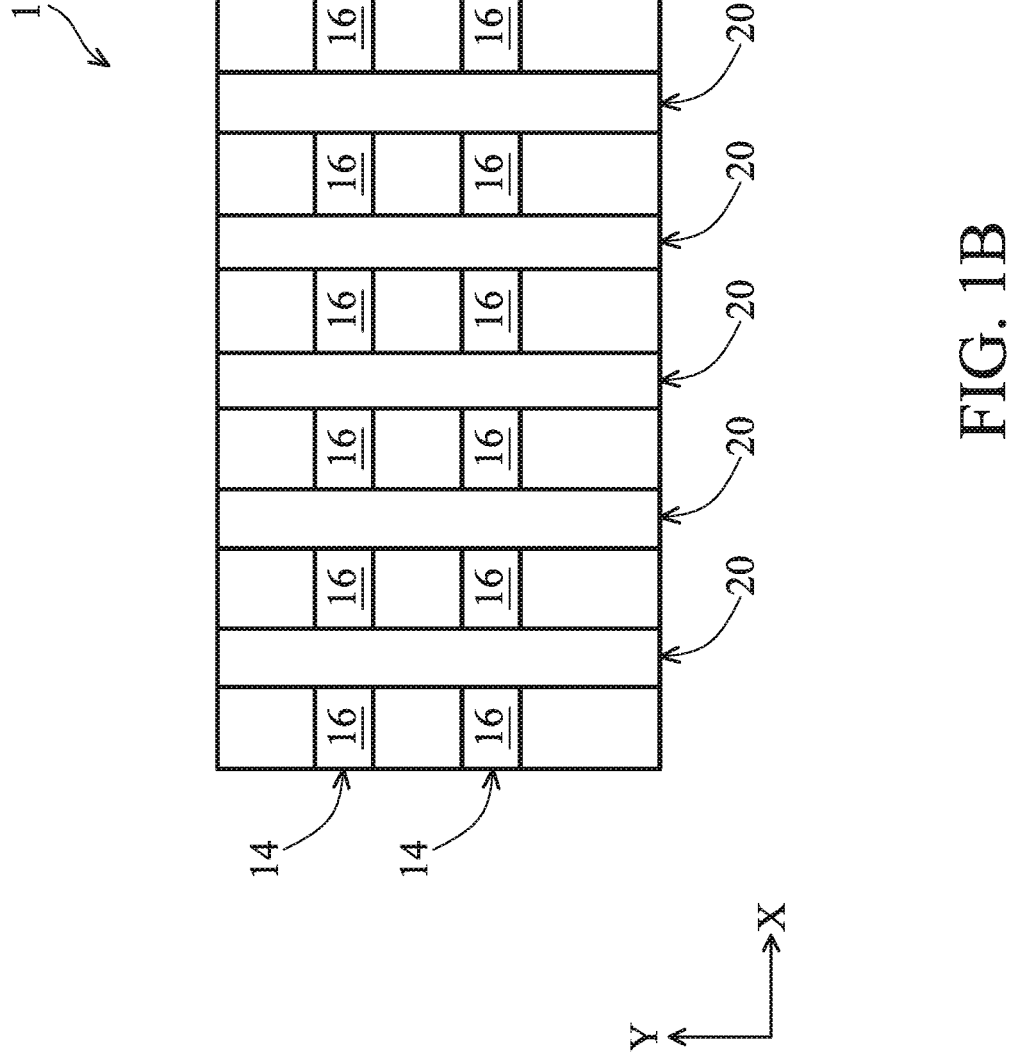

FIGS. 1A and 1B illustrate a perspective view and a top view, respectively, of a portion of an Integrated Circuit (IC) device 10, such as an SRAM device, that is implemented using GAA transistors. Referring to FIG. 1A, the IC device 10 includes a substrate 12. The substrate 12 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 12 may be a single-layer material having a uniform composition. Alternatively, the substrate 12 may include multiple material layers having similar or different compositions suitable for IC device manufacturing. In one example, the substrate 12 may be a silicon-on-insulator (SOI) substrate having a semiconductor silicon layer formed on a silicon oxide layer. In another example, the substrate 12 may include a conductive layer, a semiconductor layer, a dielectric layer, other layers, or combinations thereof. Various doped regions, such as source/drain (S/D) regions, may be formed in or on the substrate 12. The doped regions may be doped with n-type dopants, such as phosphorus or arsenic, and/or p-type dopants, such as boron, depending on design requirements. The doped regions may be formed directly on the substrate 12, in a P-well structure, in an N-well structure, in a dual-well structure, or using a raised structure. Doped regions may be formed by implantation of dopant atoms, in-situ doped epitaxial growth, and/or other suitable techniques.

Figure 2:
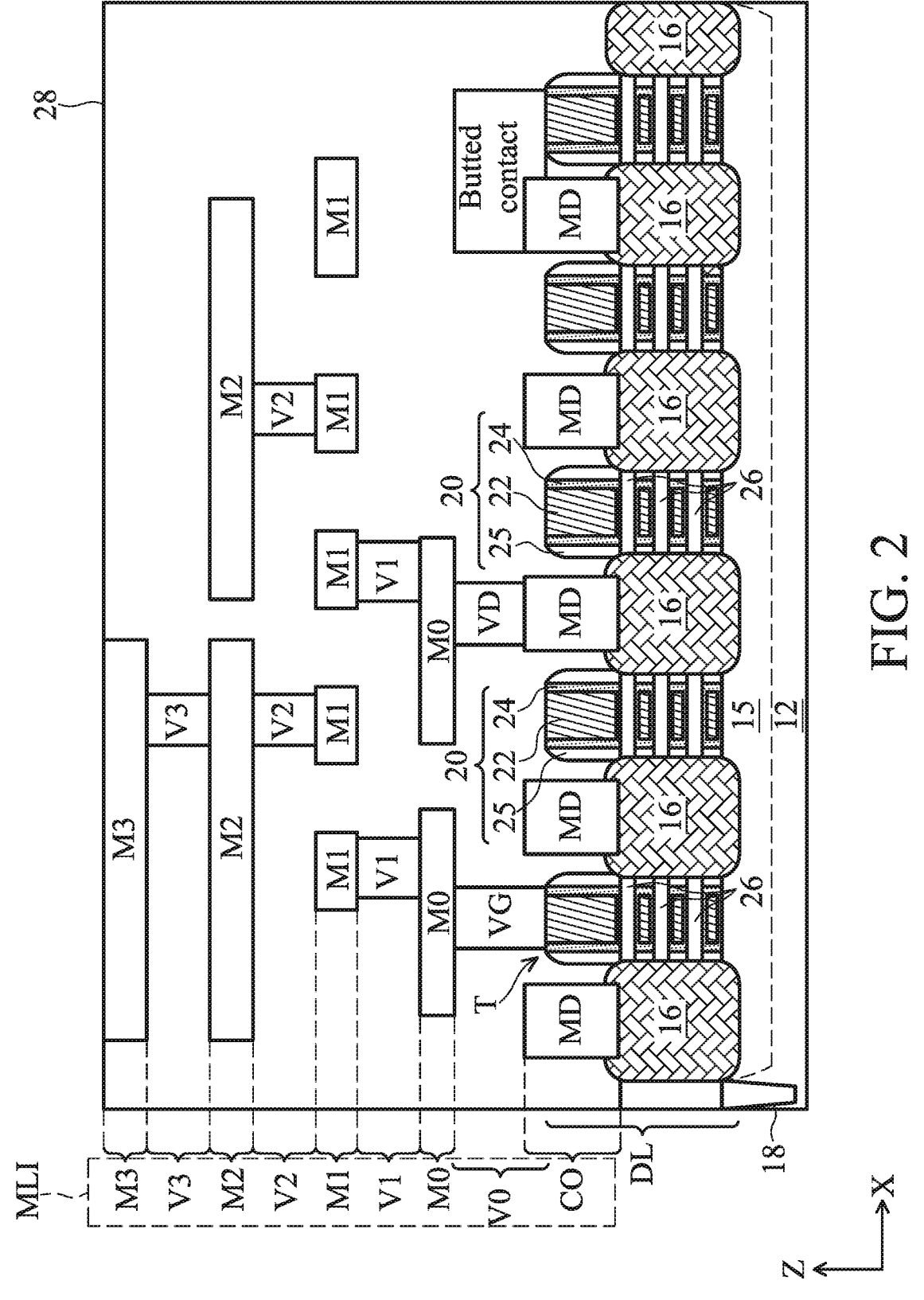
FIG. 2 illustrates a cross-sectional view of various layers of a memory device, in accordance with some embodiments of the present disclosure.

Three-dimensional active regions 14 are formed on the substrate 12. An active region for a transistor refers to the area where a source region, a drain region, and a channel region under a gate structure of the transistor are formed. An active region is also referred to as an "oxide-definition (OD) region" in the context. Each of the active regions 14 includes elongated nanostructures 26 (as shown in FIG. 2) vertically stacked in channel regions defined in the active region and above a fin-shape base. The fin-shape base protrudes upwardly out of the substrate 12. Source/drain features 16 are formed in source/drain regions defined in the active region and over the fin-shape base. The source/drain features 16 abut the two opposing ends of the nanostructures 26. The source/drain features 16 may include epi-layers that are epitaxially grown on the fin-shape base.

The IC device 10 further includes isolation structures (or isolation features) 18 formed over the substrate 12. The isolation structures 18 electrically separate various components of the IC device 10. The isolation structures 18 may include silicon oxide, silicon nitride, silicon oxynitride, fluoride-doped silicate glass (FSG), a low-k dielectric material, and/or other suitable materials. In some embodiments, the isolation structures 18 may include shallow trench isolation (STI) features. In one embodiment, the isolation structures 18 are formed by etching trenches in the substrate 12 during the formation of the active regions 14. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 18. Alternatively, the isolation structures 18 may include a multi-layer structure, for example, having one or more thermal oxide liner layers.

The IC device 10 also includes gate structures (or gate stacks) 20 formed over and engaging the active regions 14. The gate structures 20 may be dummy gate structures (e.g., containing an oxide gate dielectric and a polysilicon gate electrode), or they may be high-k metal gate (HKMG) structures that contain a high-k gate dielectric and a metal gate electrode, where the HKMG structures are formed by replacing the dummy gate structures. Though not depicted herein, the gate structure 20 may include additional material layers, such as an interfacial layer, a capping layer, other suitable layers, or combinations thereof.

Referring to FIG. 1B, multiple active regions 14 are oriented lengthwise along the X-direction, and multiple gate structures 20 are oriented lengthwise along the Y-direction, i.e., generally perpendicular to the active regions 14. At intersections of the active regions 14 and the gate structures 20, transistors are formed. In many embodiments, the IC device 10 includes additional features such as gate spacers disposed along sidewalls of the gate structures 20, and numerous other features.

FIG. 2 is a fragmentary diagrammatic cross-sectional view along A-A line of FIG. 1A, which shows various layers (levels) that can be fabricated over the substrate 12, according to various aspects of the present disclosure. In FIG. 2, the various layers include a device layer DL and a multilayer interconnect MLI disposed over the device layer DL. Device layer DL includes devices (e.g., transistors, resistors, capacitors, and/or inductors) and/or device components (e.g., doped wells, gate structures, and/or source/drain features). In some embodiments, device layer DL includes the substrate 12, doped regions 15 disposed in the substrate 12 (e.g., n-wells and/or p-wells), isolation features 18, and transistors T. In the depicted embodiment, transistors T include suspended nanostructures (channel layers) 26 and the gate structures 20 disposed between source/drain features 16, where the gate structures 20 wrap and/or surround the suspended nanostructures 26. The nanostructures 26 may include nanosheets, nanotubes, or nanowires, or some other type of nanostructure that extends horizontally in the X-direction. Each gate structure 20 has a metal gate structure formed from a gate electrode 22 disposed over a gate dielectric 24 and gate spacers 25 disposed along sidewalls of the metal gate structure.

Multilayer interconnect MLI electrically couples various devices and/or components of device layer DL, such that the various devices and/or components can operate as specified by design requirements for the memory. In the depicted embodiment, multilayer interconnect MLI includes a contact layer (CO level), a via zero layer (V0 level), a metal zero (M0) level, a via one layer (V1 level), a metal one layer (M1 level), a via two layer (V2 level), a metal two layer (M2 level), a via three layer (V3 level), and a metal three layer (M3 level). The present disclosure contemplates multilayer interconnect MLI having more or less layers and/or levels, for example, a total number of N metal layers (levels) of the multilayer interconnect MLI with N as an integer ranging from 2 to 10. Each level of multilayer interconnect MLI includes conductive features (e.g., metal lines, metal vias, and/or metal contacts) disposed in one or more dielectric layers (e.g., an interlayer dielectric (ILD) layer and a contact etch stop layer (CESL)). In some embodiments, conductive features at a same level of multilayer interconnect MLI, such as M1 level, are formed simultaneously. In some embodiments, conductive features at a same level of multilayer interconnect MLI have top surfaces that are substantially planar with one another and/or bottom surfaces that are substantially planar with one another. CO level includes source/drain contacts (MD) disposed in a dielectric layer 28; V0 level includes gate vias VG, source/drain contact vias VD, and butted contacts disposed in the dielectric layer 28; M0 level includes M0 metal lines disposed in dielectric layer 28, where gate vias VG connect gate structures to M0 metal lines, source/drain vias V0 connect source/drains to M0 metal lines, and butted contacts connect gate structures and source/drains together and to M0 metal lines; V1 level includes V1 vias disposed in the dielectric layer 28, where V1 vias connect M0 metal lines to M1 metal lines; M1 level includes M1 metal lines disposed in the dielectric layer 28; V2 level includes V2 vias disposed in the dielectric layer 28, where V2 vias connect M1 lines to M2 lines; M2 level includes M2 metal lines disposed in the dielectric layer 28; V3 level includes V3 vias disposed in the dielectric layer 28, where V3 vias connect M2 lines to M3 lines. FIG. 2 has been simplified for the sake of clarity to better understand the inventive concepts of the present disclosure. Additional features can be added in the various layers of the memory, and some of the features described can be replaced, modified, or eliminated in other embodiments of the memory. FIG. 2 is merely an example and may not reflect an actual cross-sectional view of the IC device 10 and/or SRAM cells 50, 100, 200 that are discussed in further detail below.

Figure 3:
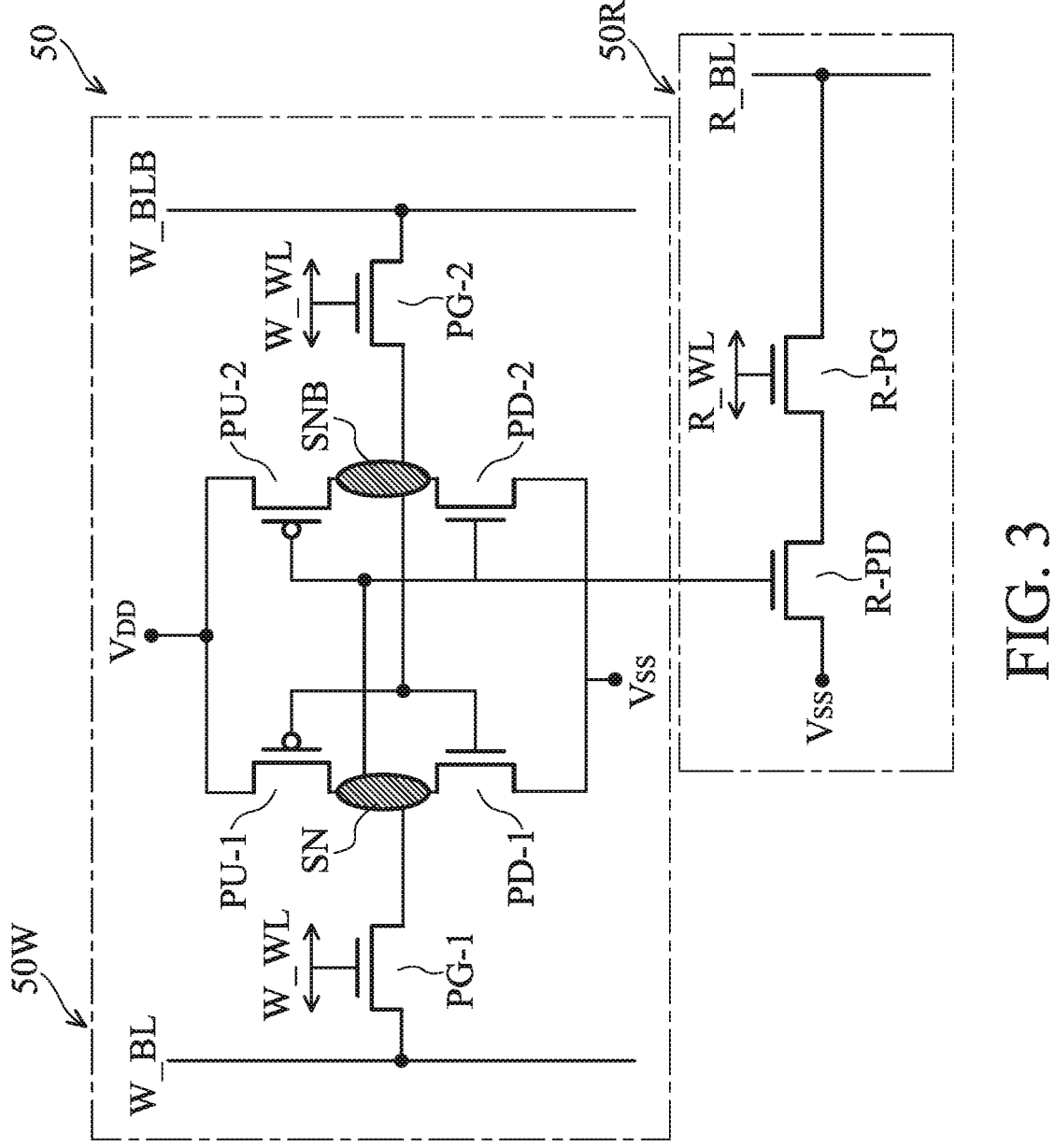
FIG. 3 illustrates a circuit schematic for a two-port static random-access memory (SRAM) cell, in accordance with some embodiments of the present disclosure.

Referring now to FIG. 3, an example circuit schematic for a two-port SRAM cell 50 is shown. The two-port SRAM cell 50 includes a write-port 50W and a read-port 50R. The write-port 50W includes pull-up transistors PU-1, PU-2, pull-down transistors PD-1, PD-2, and pass-gate transistors PG-1, PG-2. In the illustrated embodiment, transistors PU-1 and PU-2 are p-type transistors, and transistors PG-1, PG-2, PD-1, and PD-2 are n-type transistors.

The drains of the pull-up transistor PU-1 and the pull-down transistor PD-1 are coupled together, and the drains of the pull-up transistor PU-2 and the pull-down transistor PD-2 are coupled together. The transistors PU-1 and PD-1 are cross-coupled with the transistors PU-2 and PD-2 to form a data latch. The gates of the transistors PU-2 and PD-2 are coupled together and to the common drains of the transistors PU-1 and PD-1 to form a storage node SN, and the gates of the transistors PU-1 and PD-1 are coupled together and to the common drains of the transistors PU-2 and PD-2 to form a complementary storage node SNB. Sources of the pull-up transistors PU-1 and PU-2 are coupled to a power voltage Vdd (also referred to as Vcc), and the sources of the pull-down transistors PD-1 and PD-2 are coupled to a voltage Vss, which may be an electrical ground in some embodiments.

The storage node SN of the data latch is coupled to a bit line W_BL of the write-port 50W through the pass-gate transistor PG-1, and the complementary storage node SNB is coupled to a complementary bit line W_BLB of the write-port 50W through the pass-gate transistor PG-2. The storage node SN and the complementary storage node SNB are complementary nodes that are often at opposite logic levels (logic high or logic low). Gates of the pass-gate transistors PG-1 and PG-2 are coupled to a word line W_WL of the write-port 50W.

The read-port 50R of the SRAM cell 50 includes a read-port pass-gate transistor (R-PG) and a read-port pull-down transistor (R-PD). The gate of the read-port pass-gate transistor R-PG is coupled to a word line R_WL of the read-port. The gate of the read-port pull-down transistor R-PD is coupled to the storage node SN (or to the gates of the transistors PU-2 and PD-2). The read-port transistors R-PG and R-PD are coupled between the bit line R_BL of the read-port and Vss.

According to the various aspects of the present disclosure, the transistor R-PD and R-PG of the read-port are implemented to have wider channel widths than all the transistors of the write-port. Even within the write-port, the transistors PU-1 and PU-2 are implemented to have thinner channel widths than the transistors PD-1, PD-2, PG-1, and PG-2. In some embodiments, the transistors R-PD, PD-2, and PU-2 may share a continuous gate structure, but they are implemented with different work function metals for their respective gate electrodes, and/or with different gate dielectrics (e.g., doped v.s. non-doped gate dielectric). Such configurations help to optimize the performance of the two-port SRAM cell 50, for example by increasing reading and/or writing speed while reducing parasitic capacitance or leakage.

Figure 4:
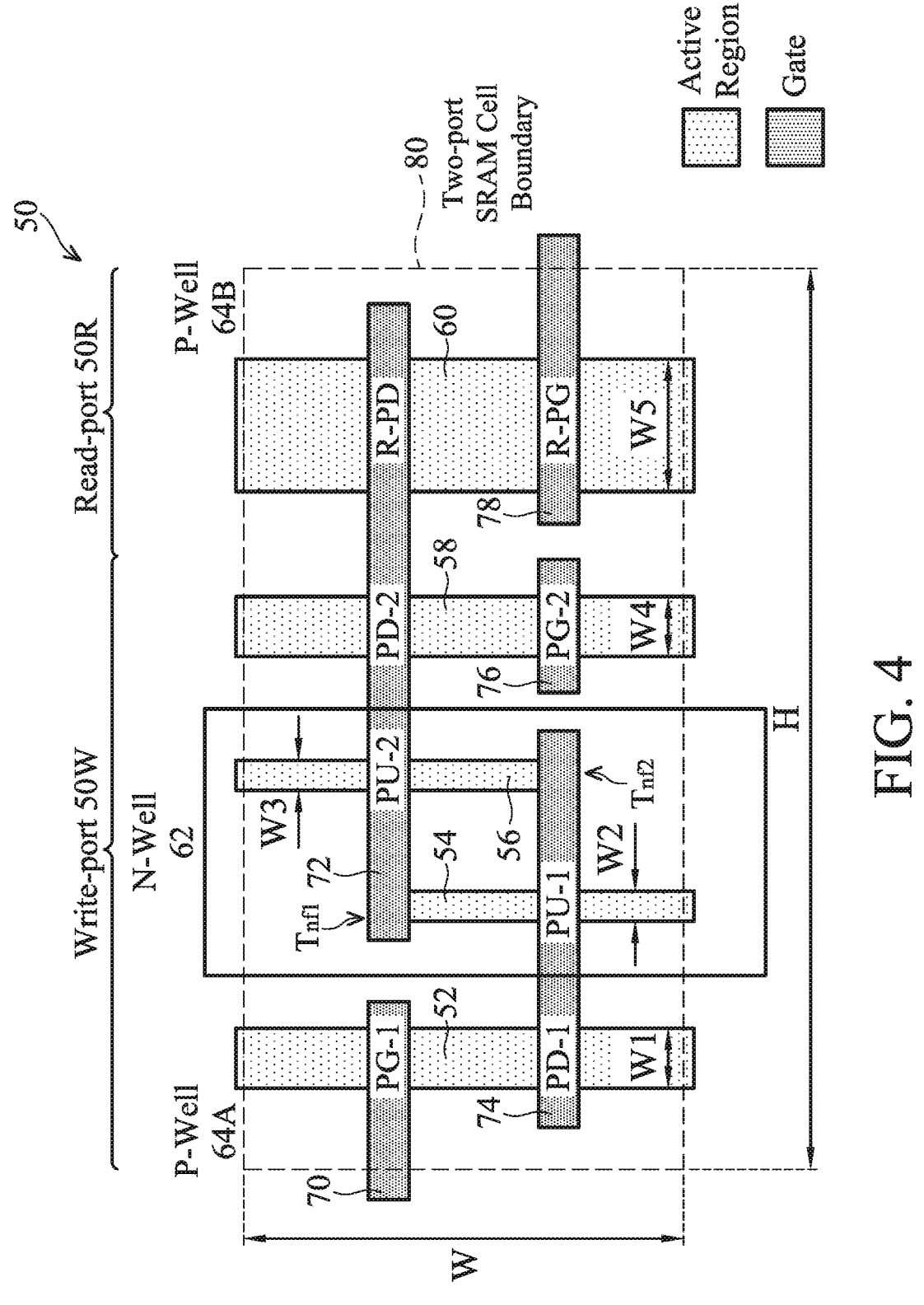
FIG. 4 illustrates a top view of the two-port SRAM cell as in FIG. 3, in accordance with some embodiments of the present disclosure.

FIG. 4 illustrates a simplified diagrammatic top view of the two-port SRAM cell 50, which includes the write-port 50W and the read-port 50R. The write-port 50W includes the transistors PG-1, PG-2, PU-1, PU-2, PD-1, and PD-2. The read-port 50R includes the transistors R_PD and R_PG. For reasons of visual clarity and simplicity, the active regions and the gate structures of these transistors are shown in FIG. 4, but the interconnection components such as contacts, vias, and metal lines are omitted from FIG. 4.

As shown in FIG. 4, the two-port SRAM cell 50 includes active regions 52, 54, 56, 58, and 60. The active regions 52-60 each extend lengthwise in the X-direction in FIG. 4. In the illustrated embodiment, the active regions 52-60 may each include (or may be implemented as) the nanostructures 26 of FIG. 2 discussed above. In other embodiments, the active regions 52-60 may include fin structures as well. The active regions 52-58 are components of the write-port 50W, and the active region 60 is a component of the read-port 50R. In the illustrated embodiment, the active regions 54, 56 belong to the transistors PU-1 and PU-2, respectively, which are PMOS devices. As such, the active regions 54, 56 are formed over an N-well 62. Meanwhile, the active region 52 belongs to the transistors PD-1 and PG-1, which are NMOS devices. As such, the active region 52 is formed over a P-well 64A (or a P-type substrate). Similarly, the active regions 58, 60 belong to the transistors PG-2, PD-2, R-PG, and R-PD, which are NMOS devices. As such, the active regions 58, 60 are formed over a P-well 64B (or a P-type substrate). The P-wells 64A, 64B are collectively referred to as P-wells 64.

As shown in FIG. 4, the two-port SRAM cell 50 further includes gate structures 70, 72, 74, 76, and 78. The gate structures 70-78 each extend lengthwise in the Y-direction in FIG. 4. The gate structures 70-78 may each include (or may be implemented as) the gate structures 20 of FIG. 2 discussed above. The gate structures 70, 74, and 76 are components of the write-port 50W. The gate structure 78 is a component of the read-port 50R. The gate structure 72 extends through both the write-port 50W and the read-port 50R. As such, a portion of the gate structure 72 is a component of the write-port 50W, and another portion of the gate structure 72 is a component of the read-port 50R. In other words, the gate structure 72 is shared by the transistor R_PD of the read-port 50R and the transistors PU-2 and PD-2 of the write-port 50W.

Different active regions in different transistors of the SRAM cell 50 may have different widths (e.g., dimensions measured in the Y-direction) in order to optimize device performance. In more detail, the active region 52 of the PD-1 transistor and the PG-1 transistor has a width W1, the active region 54 of the PU-1 transistor has a width W2, the active region 56 of the PU-2 transistor has a width W3, the active region 58 of the PG-2 transistor and the PD-2 transistor has a width W4, and the active region 60 of the R_PG transistor and the R_PD transistor has a width W5. The widths W1-W5 are measured in the portions of the respective active regions underneath the gate structures 70-78. In other words, these portions of the active regions (from which the widths W1-W5 are measured) are the channel regions (e.g., the vertically-stacked nanostructures of GAA devices) of the transistors. To optimize SRAM performance, the width W5 is configured to be greater than W1-W4 in order to improve read speed of the SRAM cell 50, the widths W2 and W3 are configured to be smaller than the widths W1 and W4 in order to balance the speed among the PMOS devices and the NMOS devices. Further, the widths W2 and W3 may be the same, and the widths W1 and W4 may be the same, in some embodiments.

Still referring to FIG. 4, a boundary 80 of the two-port SRAM cell 50 is illustrated in FIG. 4 using broken lines. Note that some of the active regions and gate structures may extend beyond the illustrated boundary 80, since these active regions and gate structures may also form components of other adjacently located SRAM cells as well. The boundary 80 is longer in the Y-direction than in the X-direction, for example about 3.5 times to about 6 times longer. In other words, the boundary 80 may be rectangular. The first dimension of the boundary 80 along the X-direction is denoted as a cell width W, and the second dimension of the boundary 80 along the Y-direction is denoted as a cell height H. Where the two-port SRAM cell 50 is repeated in a memory array, the cell width W may represent and be referred to as a memory cell pitch in the memory array along the X-direction, and the cell height H may represent and be referred to as a memory cell pitch in the memory array along the Y-direction.

The cell size of the two-port SRAM cell 50 is W×H, in which the cell width W is about 2 times a poly pitch (e.g., a center-to-center distance between two adjacent gate structures along the X-direction) and the cell height H is about 5 times an isolation pitch (e.g., a center-to-center distance between two adjacent STI features along the Y-direction). Denoting an area of one poly pitch times one isolation pitch as a unit area, each unit area includes an intersection of a gate structure and an active region, and the two-port SRAM cell 50 utilizes a cell size of about 10 times a unit area in accommodating the eight transistors, namely the transistors PG-1, PG-2, PU-1. PU-2, PD-1, PD-2, R-PD, and R-PG. Still, the area utilization rate is not optimized inside the two-port SRAM cell 50. Since a transistor is formed at an intersection of a gate structure and an active region, a cell size of 10 times a unit area are supposed to accommodate 10 transistors. This is because the transistor $T_{nf1}$ formed at the intersection of the active region 54 and the gate structure 72 is a first non-functional transistor, and the transistor $T_{nf2}$ formed at the intersection of the active region 56 and the gate structure 74 is a second non-functional transistor. Accordingly, design and layout of a two-port SRAM cell can still be further improved.

Figure 5:
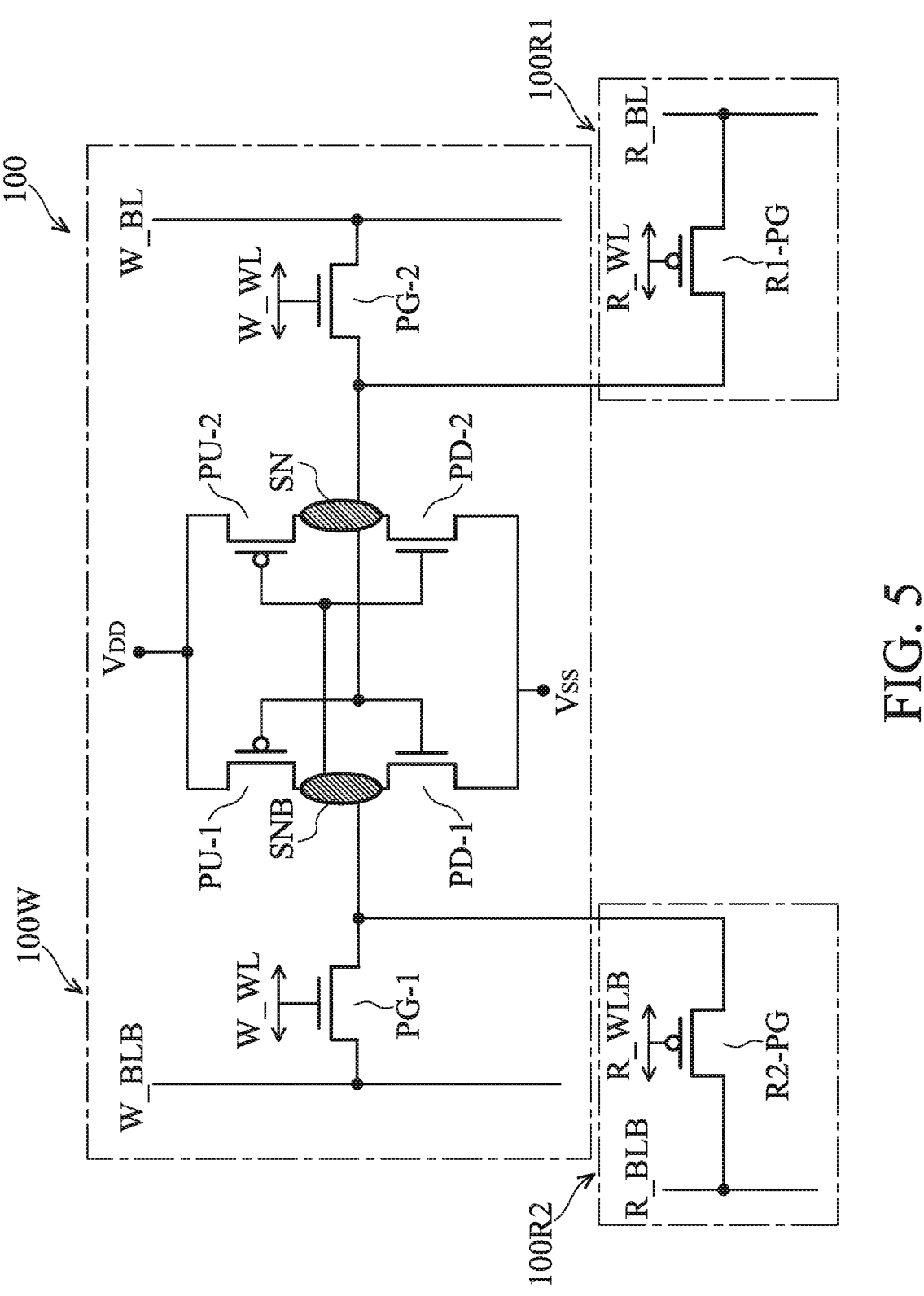
FIG. 5 illustrates a circuit schematic for a two-port SRAM cell, in accordance with some embodiments of the present disclosure.

Referring now to FIG. 5, an example circuit schematic for a two-port SRAM cell 100 is shown. The two-port SRAM cell 100 includes a write-port 100W, a first read-port 100R1, and a second read-port 100R2. The write-port 100W includes pull-up transistors PU-1, PU-2, pull-down transistors PD-1, PD-2, and pass-gate transistors PG-1, PG-2. In the illustrated embodiment, transistors PU-1 and PU-2 are p-type transistors, and transistors PG-1, PG-2, PD-1, and PD-2 are n-type transistors.

The drains of the pull-up transistor PU-1 and the pull-down transistor PD-1 are coupled together, and the drains of the pull-up transistor PU-2 and the pull-down transistor PD-2 are coupled together. The transistors PU-1 and PD-1 are cross-coupled with the transistors PU-2 and PD-2 to form a data latch. The gates of the transistors PU-1 and PD-1 are coupled together and to the common drains of the transistors PU-2 and PD-2 to form a storage node SN, and the gates of the transistors PU-2 and PD-2 are coupled together and to the common drains of the transistors PU-1 and PD-1 to form a complementary storage node SNB. Sources of the pull-up transistors PU-1 and PU-2 are coupled to a power voltage Vdd (also referred to as Vcc), and the sources of the pull-down transistors PD-1 and PD-2 are coupled to a voltage Vss, which may be an electrical ground in some embodiments.

The storage node SN of the data latch is coupled to a bit line W_BL of the write-port 100W through the pass-gate transistor PG-2, and the complementary storage node SNB is coupled to a complementary bit line W_BLB of the write-port 100W through the pass-gate transistor PG-1. The storage node SN and the complementary storage node SNB are complementary nodes that are often at opposite logic levels (logic high or logic low). Gates of the pass-gate transistors PG-1 and PG-2 are coupled to a word line W_WL of the write-port 100W.

The first read-port 100R1 of the SRAM cell 100 includes a first read-port pass-gate transistor (R1-PG) coupled between the bit line R_BL and the storage node SN (or to the gates of the transistors PU-1 and PD-1). The gate of the first read-port pass-gate transistor R1-PG is coupled to a word line R_WL of the first read-port 100R1. The second read-port 100R2 of the SRAM cell 100 includes a second read-port pass-gate transistor (R2-PG) coupled between the complementary bit line R_BLB and the complementary storage node SNB (or to the gates of the transistors PU-2 and PD-2). The gate of the second read-port pass-gate transistor R2-PG is coupled to a complementary word line R_WLB of the second read-port 100R2. In the illustrated embodiment, the transistors R1-PG and R2-PG are p-type transistors. That is, in the two-port SRAM cell 100, the pass-gate transistors in a write-port are n-type transistors, and the pass-gate transistors in read-ports are p-type transistors.

Figure 6:
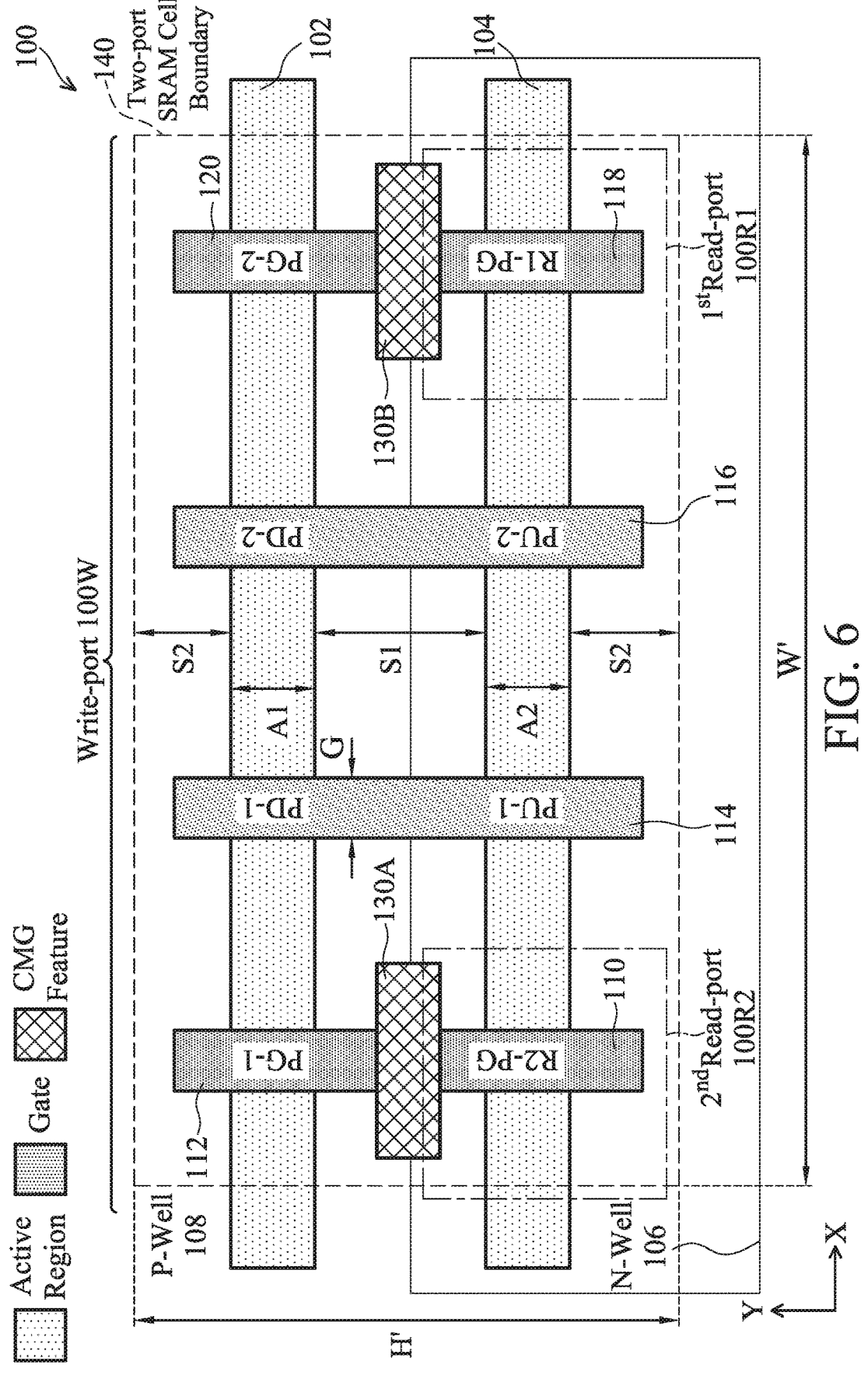
FIGS. 6 and 7 illustrate top views of the two-port SRAM cell as in FIG. 5, in accordance with some embodiments of the present disclosure.

FIG. 6 illustrates a simplified diagrammatic top view of the two-port SRAM cell 100, which includes the write-port 100W, the first read-port 100R1, and the second read-port 100R2. The write-port 100W includes the transistors PG-1, PG-2, PU-1, PU-2, PD-1, and PD-2. The first read-port 100R1 includes the transistor R1-PG. The second read-port 100R2 includes the transistor R2-PG. For reasons of visual clarity and simplicity, the active regions and the gate structures of these transistors, together with some gate-cut features, are shown in FIG. 6, while the interconnection components such as contacts, vias, and metal lines are omitted from FIG. 6.

As shown in FIG. 6, the two-port SRAM cell 100 includes active regions 102 and 104. The active regions 102, 104 each extend lengthwise in the X-direction in FIG. 6. In the illustrated embodiment, the active regions 102, 104 may each include (or may be implemented as) the nanostructures 26 of FIG. 2 discussed above. In other embodiments, the active regions 102, 104 may include fin structures as well. The active region 102 are a components of the write-port 100W, and the active region 104 has a side portion as a component of the first read-port 100R1, a middle portion as a component of the write-port 100W, and another side portion as a component of the second read-port 100R2. In other words, the active region 104 is shared by the two read-ports 100R1, 100R2 and the write-port 100W. In the illustrated embodiment, the active region 104 belong to the transistors PU-1, PU-2, R1-PG, R2-PG, which are PMOS devices. As such, the active region 104 is formed over an N-well 106. Meanwhile, the active region 102 belongs to the transistors PG-1, PD-1, PD-2, PG-2, which are NMOS devices. As such, the active region 102 is formed over a P-well 108 (or a P-type substrate).

As shown in FIG. 6, the two-port SRAM cell 100 further includes gate structures 110, 112, 114, 116, 118, and 120. The gate structures 110-120 each extend lengthwise in the Y-direction in FIG. 6. The gate structures 110-120 may each include (or may be implemented as) the gate structures 20 of FIG. 2 discussed above. The gate structures 112, 114, 116, and 120 are components of the write-port 100W. The gate structure 118 is a component of the first read-port 100R1. The gate structure 110 is a component of the second read-port 100R2. The gate structures 114, 116 each extend through the two active regions 102, 104. As such, the gate structure 114 is shared by the transistors PD-1 and PU-1, and the gate structure 116 is shared by the transistors PD-2 and PU-2.

Still referring to FIG. 6, the two-port SRAM cell 100 further includes a plurality of gate-cut dielectric features extending lengthwise along the X-direction, including dielectric features 130A, 130B (collectively, dielectric features 130). In the illustrated embodiment, the dielectric feature 130A is disposed between the active regions 102, 104 and abuts the gate structure 110 and the gate structure 112. The dielectric feature 130A divides an otherwise continuous gate structure into two isolated segments corresponding to the gate structure 110 and the gate structure 112. Similarly, the dielectric feature 130B is disposed between the active regions 102, 104 and abuts the gate structure 118 and the gate structure 120. The dielectric feature 130B divides an otherwise continuous gate structure into two isolated segments corresponding to the gate structure 118 and the gate structure 120. Each of the dielectric features 130 is formed by filling a corresponding cut-metal-gate (CMG) trench in the position of the dielectric features. The dielectric features 130 are also referred to as CMG features. In the illustrated embodiment, each of the dielectric features 130A, 130B is disposed above an interface between the N-well 106 and the P-well 108.

A CMG process refers to a fabrication process where after a metal gate (e.g., a high-k metal gate or HKMG) replaces a dummy gate structure (e.g., a polysilicon gate), the metal gate is cut (e.g., by an etching process) to separate the metal gate into two or more gate segments. Each gate segment functions as a metal gate for an individual transistor. An isolation material is subsequently filled into trenches between adjacent portions of the metal gate. These trenches are referred to as cut-metal-gate trenches, or CMG trenches, in the present disclosure. The dielectric material filling a CMG trench for isolation is referred to as a CMG feature. To ensure a metal gate would be completely cut, a CMG feature often further extends into adjacent areas, such as dielectric layers filling space between the metal gates. A CMG feature often have an elongated shape in a top view.

Still referring to FIG. 6, a boundary 140 of the two-port SRAM cell 100 is illustrated in FIG. 6 using broken lines. Note that some of the active regions and gate structures may extend beyond the illustrated boundary 140, since these active regions and gate structures may also form components of other adjacently located SRAM cells as well. The boundary 140 is longer in the X-direction than in the Y-direction. In other words, the boundary 140 may be rectangular. The first dimension of the boundary 140 along the X-direction is denoted as a cell width W', and the second dimension of the boundary 140 along the Y-direction is denoted as a cell height H'. Where the two-port SRAM cell 100 is repeated in a memory array, the cell width W' may represent and be referred to as a memory cell pitch in the memory array along the X-direction, and the cell height H' may represent and be referred to as a memory cell pitch in the memory array along the Y-direction.

The cell size of the two-port SRAM cell 100 is W'×H', in which the cell width W' is about 4 times a poly pitch (e.g., a center-to-center distance between two adjacent gate structures along the X-direction) and the cell height H' is about 2 times an isolation pitch (e.g., a center-to-center distance between two adjacent STI features along the Y-direction). Denoting an area of one poly pitch times one isolation pitch as a unit area, each unit area includes an intersection of a gate structure and an active region, and the two-port SRAM cell 100 utilizes a cell size of about 8 times a unit area in accommodating the eight transistors, namely the transistors PG-1, PG-2, PU-1, PU-2, PD-1, PD-2, R1-PG, and R2-PG. The area utilization rate is higher than that of the two-port SRAM cell 50. This is because each transistor formed at an intersection of a gate structure and an active region is a functional transistor. There is no non-functional transistor in the two-port SRAM cell 100. In some embodiments, the SRAM cell 100 has a cell size about 20% to about 33% smaller than a cell size of the SRAM cell 50.

FIG. 6 also illustrates dimensions of some features in the layout of the SRAM cell 100. The active region 102 has a width denoted as A1, the active region 104 has a width denoted as A2, each of the gate structures 110-120 has a critical dimension (CD) or gate width denoted as G. A distance (along the Y-direction) between opposing edges of the active regions 102, 104 is denoted as S1. A distance (along the Y-direction) between an edge of the active region 102 or 104 and a respective closest edge of the boundary 140 is denoted as S2. Therefore, the cell height H' of the SRAM cell 100 is A1+A2+S1+2×S2. In some embodiments, G ranges from about 10 nm to about 20 nm; A1 ranges from about 11 nm to about 35 nm; A2 ranges from about 11 nm to about 35 nm; and S1 ranges from about 30 nm to about 80 nm. A ratio between A2 and A1 (A2/A1) ranges from about 0.3 to about 3.5. This range is not trivial, as if A2/A1 is less than about 0.3, the PMOS resistance may become too large and limit the read port speed; if A2/A1 is larger than about 3.5, the NMOS resistance may become too large and limit the write port speed. In some embodiments, A2 is larger than A1 (A2>A1) to better accommodate PMOS read port speed needs. In some embodiments, A2 is smaller than A1 (A2<A1) to better accommodate NMOS write port speed needs. In some embodiments, A2 equals A1 (A2=A1) for the active regions to extend to the standard (logic) cell region to form continuous active regions across an SRAM cell region and a standard (logic) cell region. In some embodiments, S2 equals or larger than half of the S1 (S2≥0.5S1). This range is not trivial, as if S2 is smaller than 0.5×S1, the active regions 102, 104 become too close to adjacent active regions in a neighboring SRAM cell, and process window may be so limited that overlay errors may occur. In some embodiments, a ratio between A1 and G (A1/G) ranges from about 0.5 to about 4. This range is not trivial, as if A1/G is less than about 0.5, the NMOS resistance may become too large and limit the write port speed; if A1/G is larger than about 4, the active region 102 becomes too wide, and the SRAM cell area may become unnecessarily large and increase manufacturing costs. In some embodiments, a ratio between A2 and G (A2/G) ranges from about 0.5 to about 4. This range is not trivial, as if A2/G is less than about 0.5, the PMOS resistance may become too large and limit the read port speed; if A2/G is larger than about 4, the active region 104 become too wide, and the SRAM cell area may become unnecessarily large and increase manufacturing costs. In some embodiments, a ratio between S1 and G (S1/G) ranges from about 1 to about 12. This range is not trivial, as if S1/G is less than about 1, the distance between the active regions 102, 104 may become too close and isolation performance may become poor and device performance may deteriorate; if S1/G is larger than about 12, the distance between active regions 102, 104 may become too wide, and the SRAM cell area may become unnecessarily large and increase manufacturing costs.

Figure 7:
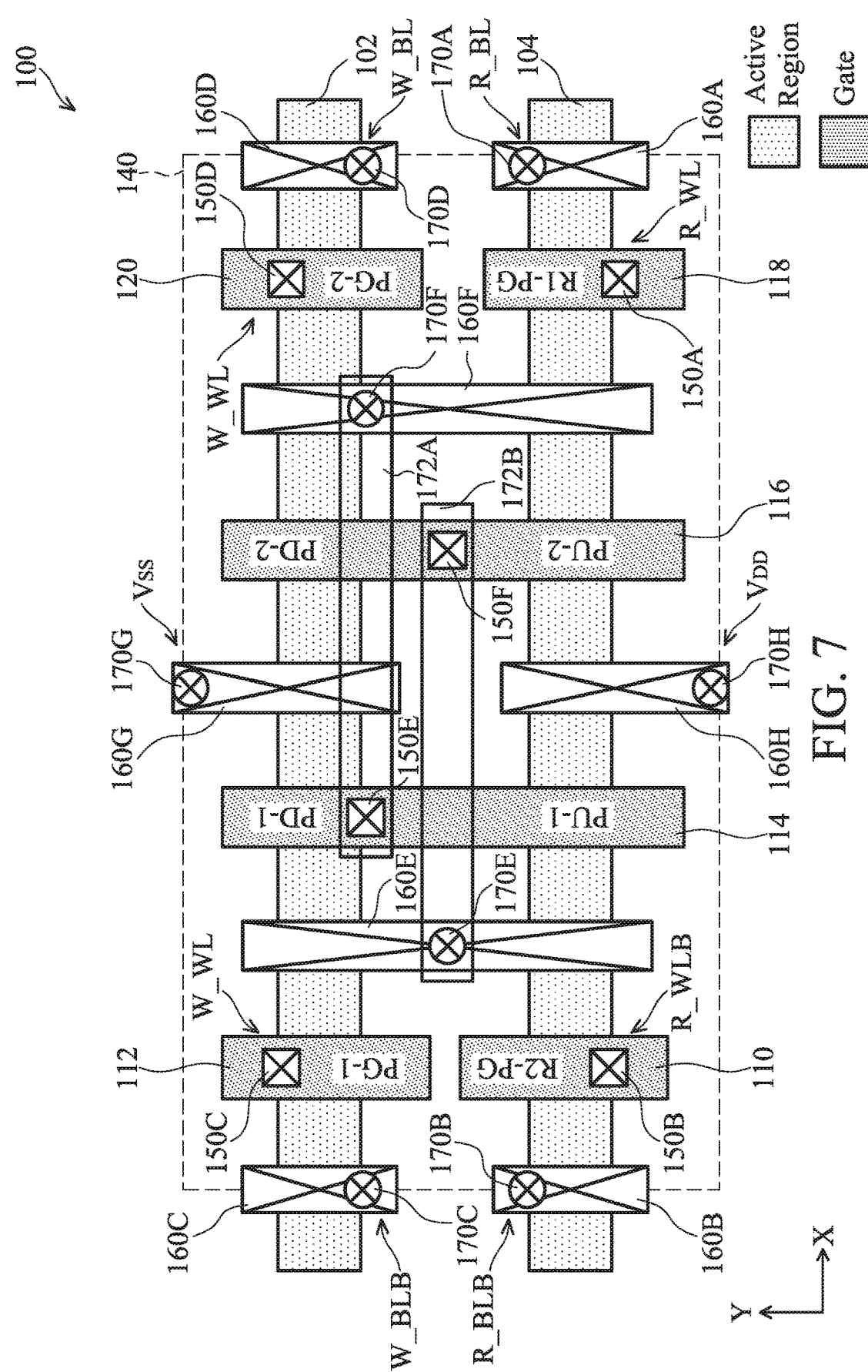

FIG. 7 illustrates conductive features of the two-port SRAM cell 100 in the contact level and the V0 level. The active regions 102-104, the gate structures 110-120, and the cell boundary 140 illustrated in FIG. 6 are reproduced in FIG. 7, while other features (such as well regions, CMG features, etc.) are omitted from FIG. 7 for reasons of visual clarity and simplicity.

A gate contact 150A electrically connects a gate of the first read-port pass-gate transistor R1-PG (formed by the gate structure 118) to the read-port word line R_WL. A gate contact 150B electrically connects a gate of the second read-port pass-gate transistor R2-PG (formed by the gate structure 110) to the read-port complementary word line R_WLB. A gate contact 150C electrically connects a gate of the write-port pass-gate transistor PG-1 (formed by the gate structure 112) to the write-port word line W_WL. A gate contact 150D electrically connects a gate of the write-port pass-gate transistor PG-2 (formed by the gate structure 120) to the write-port word line W_WL. A gate contact 150E electrically connects a gate of the write-port pull-down transistor PD-1 (formed by the gate structure 114) and a gate of the write-port pull-up transistor PU-1 (also formed by the gate structure 114) to the storage node SN. A gate contact 150F electrically connects a gate of the write-port pull-down transistor PD-2 (formed by the gate structure 116) and a gate of the write-port pull-up transistor PU-2 (also formed by the gate structure 116) to the complementary storage node SNB.

A source/drain contact 160A and a source/drain contact via 170A landing thereon electrically connect a source region of the first read-port pass-gate transistor R1-PG to the read-port bit line R_BL. A source/drain contact 160B and a source/drain contact via 170B landing thereon electrically connect a source region of the second read-port pass-gate transistor R2-PG to the read-port complementary bit line R_BLB. A source/drain contact 160C and a source/drain contact via 170C landing thereon electrically connect a source region of the write-port pass-gate transistor PG-1 to the write-port complementary bit line W_BLB. A source/drain contact 160D and a source/drain contact via 170D landing thereon electrically connect a source region of the write-port pass-gate transistor PG-2 to the write-port bit line W_BL. A source/drain contact 160E and a source/drain contact via 170E landing thereon electrically connect a common drain region of the write-port pass-gate transistor PG-1 and the write-port pull-down transistor PD-1 together with a common drain region of the write-port pull-up transistor PU-1 and the second read-port pass-gate transistor R2-PG to the complementary storage node SNB. A source/drain contact 160F and a source/drain contact via 170F landing thereon electrically connect a common drain region of the write-port pass-gate transistor PG-2 and the write-port pull-down transistor PD-2 together with a common drain region of the write-port pull-up transistor PU-2 and the first read-port pass-gate transistor R1-PG to the storage node SN. A source/drain contact 160G and a source/drain contact via 170G landing thereon electrically connect a common source region of the write-port pull-down transistor PD-1 and the write-port pull-down transistor PD-2 to the voltage node Vss. A source/drain contact 160H and a source/drain contact via 170H landing thereon electrically connect a common source region of the write-port pull-up transistor PU-1 and the write-port pull-up transistor PU-2 to the voltage node VDD.

To illustrate the connection between the gates of the transistors PD-1, PU-1 and the common drain region of the transistors PG-2, PD-2, PU-2, R1-PG as the storage node SN, FIG. 7 further illustrates an M0 metal line 172A at the M0 level. The M0 metal line 172A extends in the X-direction and connects the gate contact 150E and the source/drain contact via 170F. Since the gate contact 150E and the source/drain contact via 170F are separated by the gate structure 116 therebetween, the M0 metal line 172A hangs over the gate structure 116 and provide the function of cross coupling. This is one of the signature features in the layout of the SRAM cell 100, as butted contact is not applicable due to the insertion of the gate structure 116. To illustrate the connection between the gates of the transistors PD-2, PU-2 and the common drain region of the transistors PG-1, PD-1, PU-1, R2-PG as the complementary storage node SNB, FIG. 7 further illustrates an M0 metal line 172B at the M0 level. The M0 metal line 172B extends in the X-direction and connects the gate contact 150F and the source/drain contact via 170E. Since the gate contact 150F and the source/drain contact via 170E are separated by the gate structure 114 therebetween, the M0 metal line 172B hangs over the gate structure 114 and provide the function of cross coupling. This is one of the signature features in the layout of the SRAM cell 100, as butted contact is not applicable due to the insertion of the gate structure 114. To be noticed, there are other M0 metal lines in the layout of the SRAM cell 100 but omitted in FIG. 7 for reasons of visual clarity and simplicity.

Figure 8:
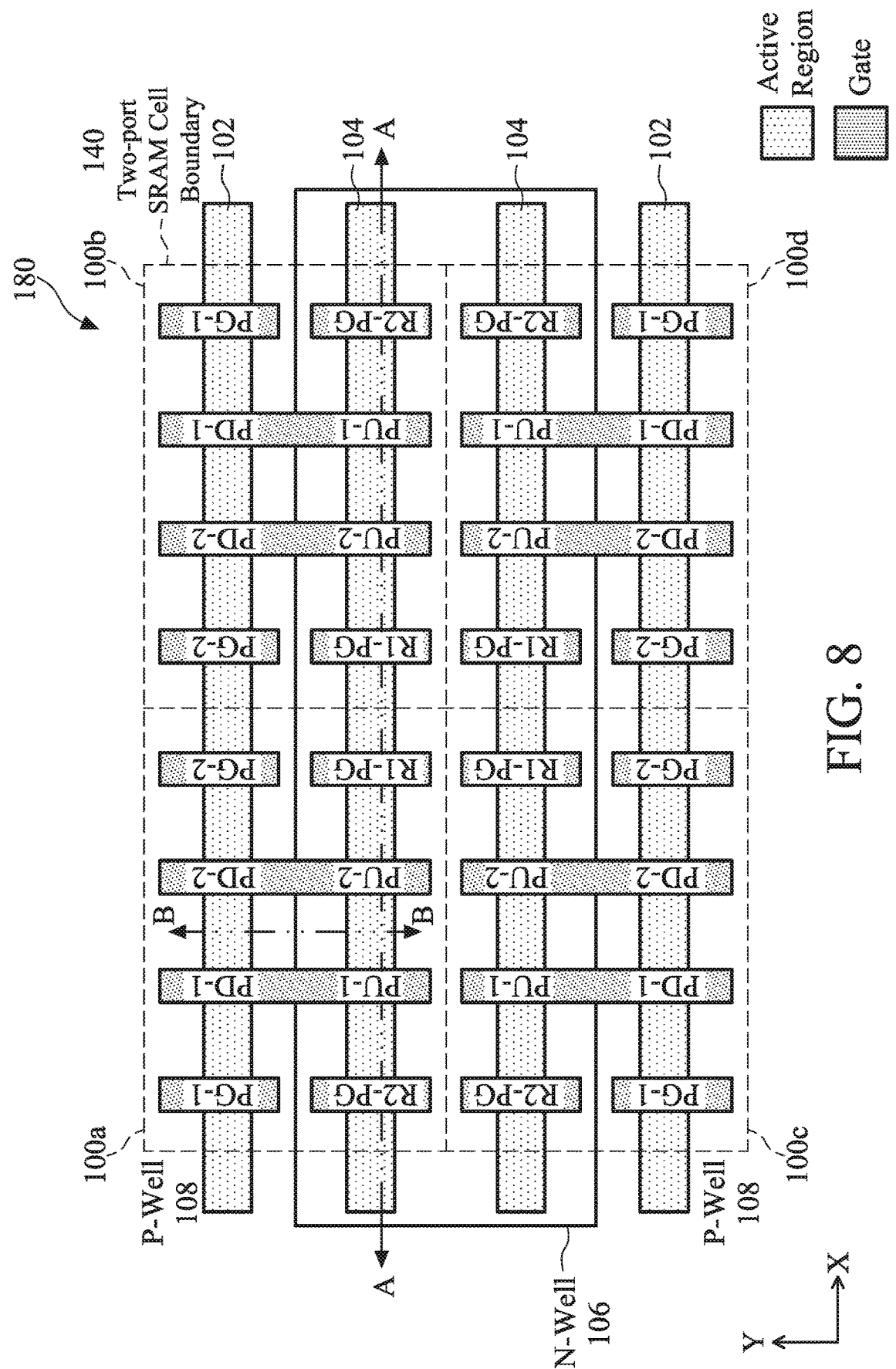
FIGS. 8 and 9 illustrate top views of an SRAM array based on the two-port SRAM cell as in FIG. 5, in accordance with some embodiments of the present disclosure.

FIG. 8 illustrates a layout of an SRAM array 180 according to the present disclosure. Referring to FIG. 8, a plurality of two-port SRAM cells 100a, 100b, 100c, and 100d are arranged in the X-direction and the Y-direction, forming a 2×2 array of SRAM cells. Each SRAM cell in the array may use the layout of the SRAM cell 100 as depicted in FIG. 6. In some embodiments, two adjacent SRAM cells in the X-direction are line symmetric with respect to a common boundary therebetween, and two adjacent SRAM cells in the Y-direction are line symmetric with respect to a common boundary therebetween. That is, the SRAM cell 100b is a duplicate cell for the SRAM cell 100a but flipped over the Y-axis; the SRAM cell 100c is a duplicate cell for the SRAM cell 100a but flipped over the X-axis; and the SRAM cell 100d is a duplicate cell for the SRAM cell 100b but flipped over the X-axis. FIG. 8 has been simplified for the sake of clarity to better understand the inventive concepts of the present disclosure. For example, active regions, gate structures, N-well, P-well, and cell boundaries for shown, while some other features are omitted in FIG. 8.

Figure 9:
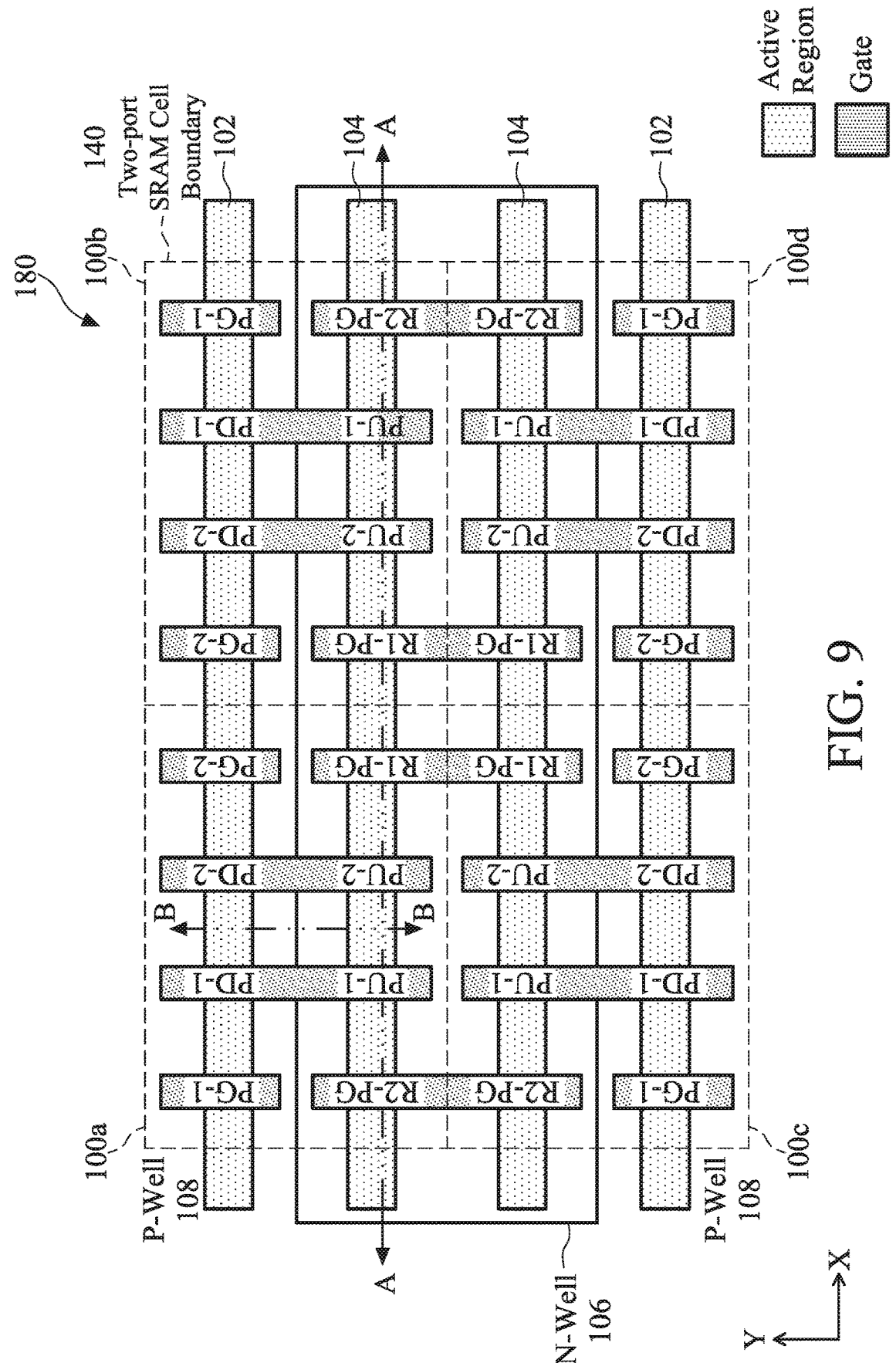

The SRAM array 180 includes well regions 106 and 108 alternately arranged along the Y-axis. In other words, every P-well region 108 is next to an N-well region 106 which is next to another P-well region 108, and this pattern repeats. In the illustrated embodiment as in FIG. 8, the gate structures in each two-port SRAM cells do not extend beyond the respective cell boundary. In some alternative embodiments, some gate structures may be shared by neighboring SRAM cells, such that these gate structures extend lengthwise across the boundary between neighboring SRAM cells. FIG. 9 illustrates such an alternative embodiment. Referring to FIG. 9, the transistor R2-PG in the SRAM cell 100a and the transistor R2-PG in the SRAM cell 100c share the same gate structure, which extends lengthwise across the boundary between the SRAM cells 100a and 100c; the transistor R1-PG in the SRAM cell 100a and the transistor R1-PG in the SRAM cell 100c shares the same gate structure, which extends lengthwise across the boundary between the SRAM cells 100a and 100c; the transistor R1-PG in the SRAM cell 100b and the transistor R1-PG in the SRAM cell 100d shares the same gate structure, which extends lengthwise across the boundary between the SRAM cells 100b and 100d; and the transistor R2-PG in the SRAM cell 100b and the transistor R2-PG in the SRAM cell 100d shares the same gate structure, which extends lengthwise across the boundary between the SRAM cells 100b and 100d.

Figure 10A:
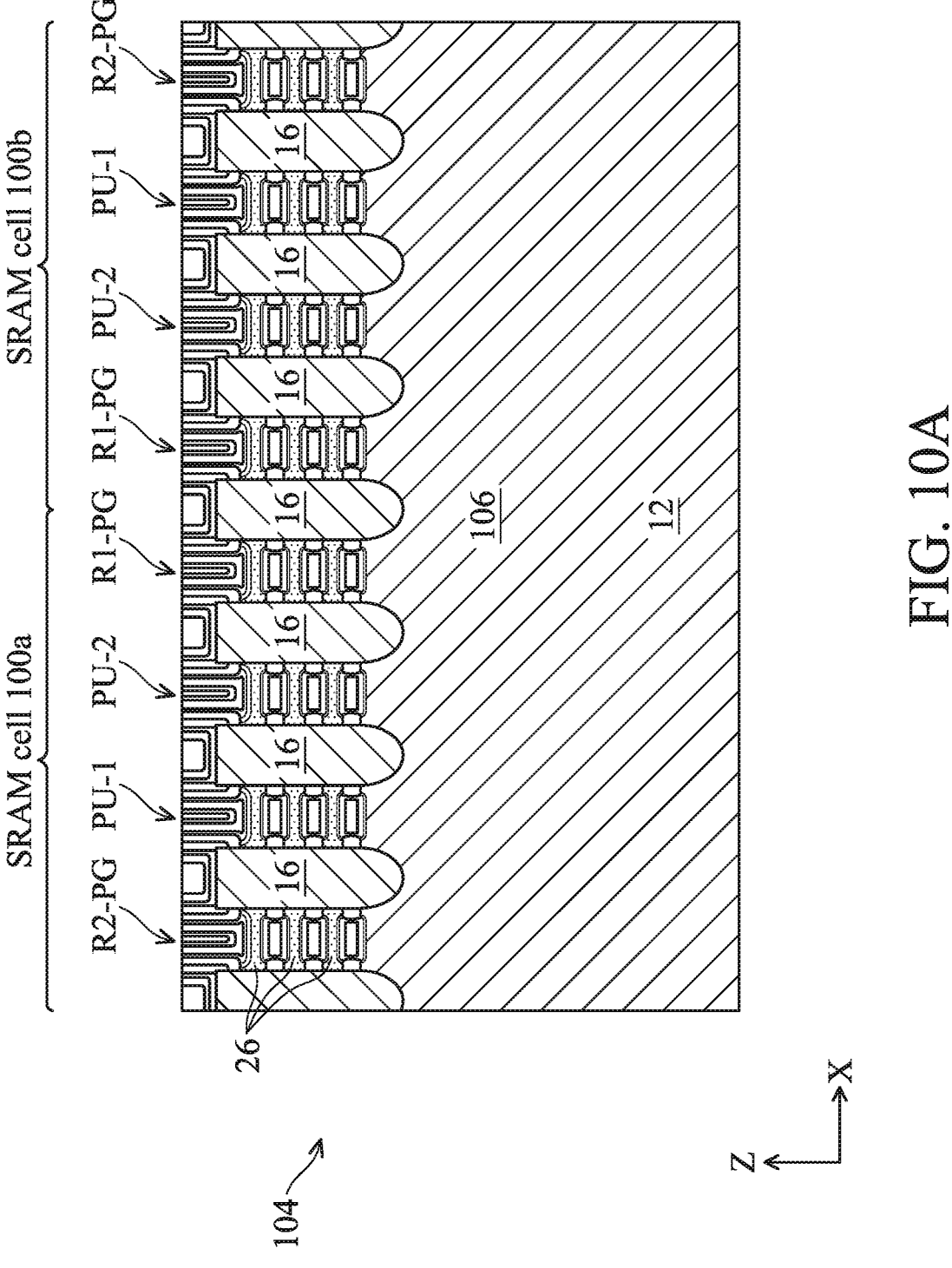
FIGS. 10A and 10B illustrate cross-sectional views of portions of the SRAM array as in FIG. 8 or FIG. 9, in accordance with some embodiments of the present disclosure.
Figure 10B:
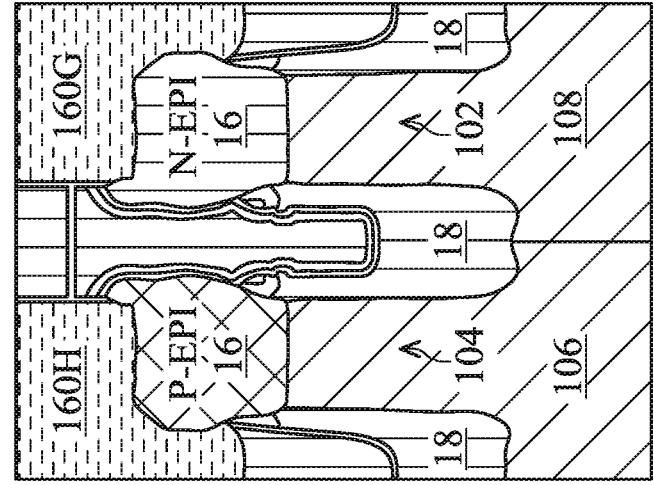

FIG. 10A is a fragmentary diagrammatic cross-sectional view along A-A line of FIG. 8 (or FIG. 9), which cuts the active region 104 along its lengthwise direction, according to various aspects of the present disclosure. FIG. 10B is a fragmentary diagrammatic cross-sectional view along B-B line of FIG. 8 (or FIG. 9), which cuts source/drain regions along a middle line of the SRAM cell 100a, according to various aspects of the present disclosure. Referring to FIGS. 10A and 10B collectively, the active region 104 extends continuously through the SRAM cells 100a, 100b (and other SRAM cells in the same row of the array 180). The active region 104 includes channel regions that is comprised of the nanostructures 26 and source/drain features 16 abut the ends of the nanostructures 26. The gate structures wrap around the nanostructures 26 and form the transistors R2-PG, PU-1, PU-2, R1-PG in the SRAM cell 100a and the transistors R1-PG, PU-2, PU-1, R2-PG in the SRAM cell 100b. The active region 104 is disposed over the N-well 106, and the active region 102 is disposed over the P-well 108. The source/drain features 16 formed on the active region 104 is p-type epitaxial features, and the source/drain features 16 formed on the active region 102 is n-type epitaxial features. The source/drain contact 160H electrically connects to the source/drain features 16 formed on the active region 104, and the source/drain contact 160G electrically connects to the source/drain features 16 formed on the active region 102.

Figure 11:
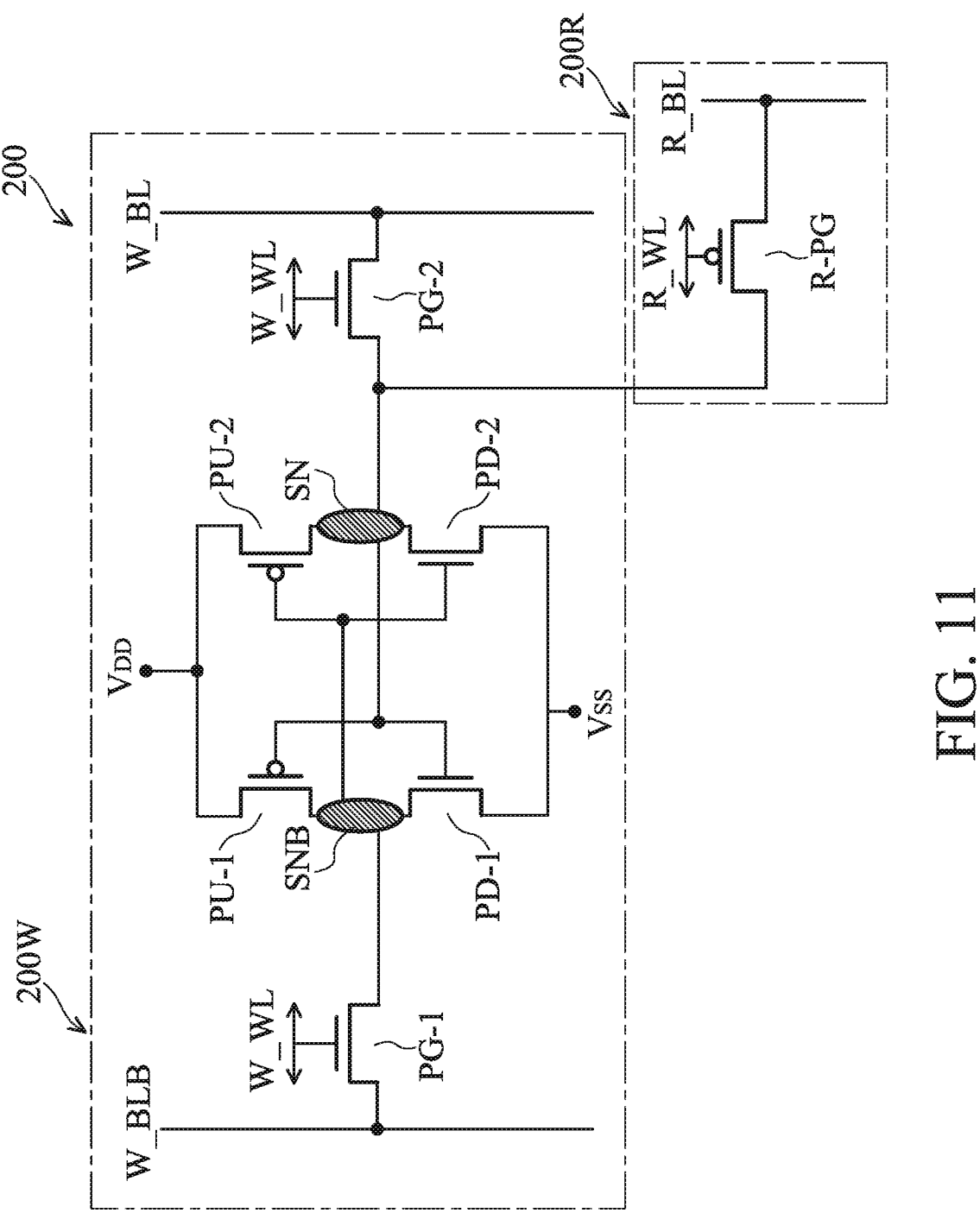
FIG. 11 illustrates a circuit schematic for a two-port SRAM cell, in accordance with some embodiments of the present disclosure.

Referring now to FIG. 11, an example circuit schematic for a two-port SRAM cell 200 is shown. The two-port SRAM cell 200 includes a write-port 200W and a read-port 200R. The write-port 200W includes pull-up transistors PU-1, PU-2, pull-down transistors PD-1, PD-2, and pass-gate transistors PG-1, PG-2. In the illustrated embodiment, transistors PU-1 and PU-2 are p-type transistors, and transistors PG-1, PG-2, PD-1, and PD-2 are n-type transistors.

The drains of the pull-up transistor PU-1 and the pull-down transistor PD-1 are coupled together, and the drains of the pull-up transistor PU-2 and the pull-down transistor PD-2 are coupled together. The transistors PU-1 and PD-1 are cross-coupled with the transistors PU-2 and PD-2 to form a data latch. The gates of the transistors PU-1 and PD-1 are coupled together and to the common drains of the transistors PU-2 and PD-2 to form a storage node SN, and the gates of the transistors PU-2 and PD-2 are coupled together and to the common drains of the transistors PU-1 and PD-1 to form a complementary storage node SNB. Sources of the pull-up transistors PU-1 and PU-2 are coupled to a power voltage Vdd (also referred to as Vcc), and the sources of the pull-down transistors PD-1 and PD-2 are coupled to a voltage Vss, which may be an electrical ground in some embodiments.

The storage node SN of the data latch is coupled to a bit line W_BL of the write-port 200W through the pass-gate transistor PG-2, and the complementary storage node SNB is coupled to a complementary bit line W_BLB of the write-port 200W through the pass-gate transistor PG-1. The storage node SN and the complementary storage node SNB are complementary nodes that are often at opposite logic levels (logic high or logic low). Gates of the pass-gate transistors PG-1 and PG-2 are coupled to a word line W_WL of the write-port 200W.

The read-port 200R of the SRAM cell 200 includes a read-port pass-gate transistor (R-PG) coupled between the bit line R_BL and the storage node SN (or to the gates of the transistors PU-1 and PD-1). The gate of the read-port pass-gate transistor R-PG is coupled to a word line R_WL of the read-port 200R. In the illustrated embodiment, the transistor R-PG is a p-type transistor. That is, in the two-port SRAM cell 200, the pass-gate transistors in a write-port are n-type transistors, and the pass-gate transistor in a read-port is a p-type transistor.

Figure 12:
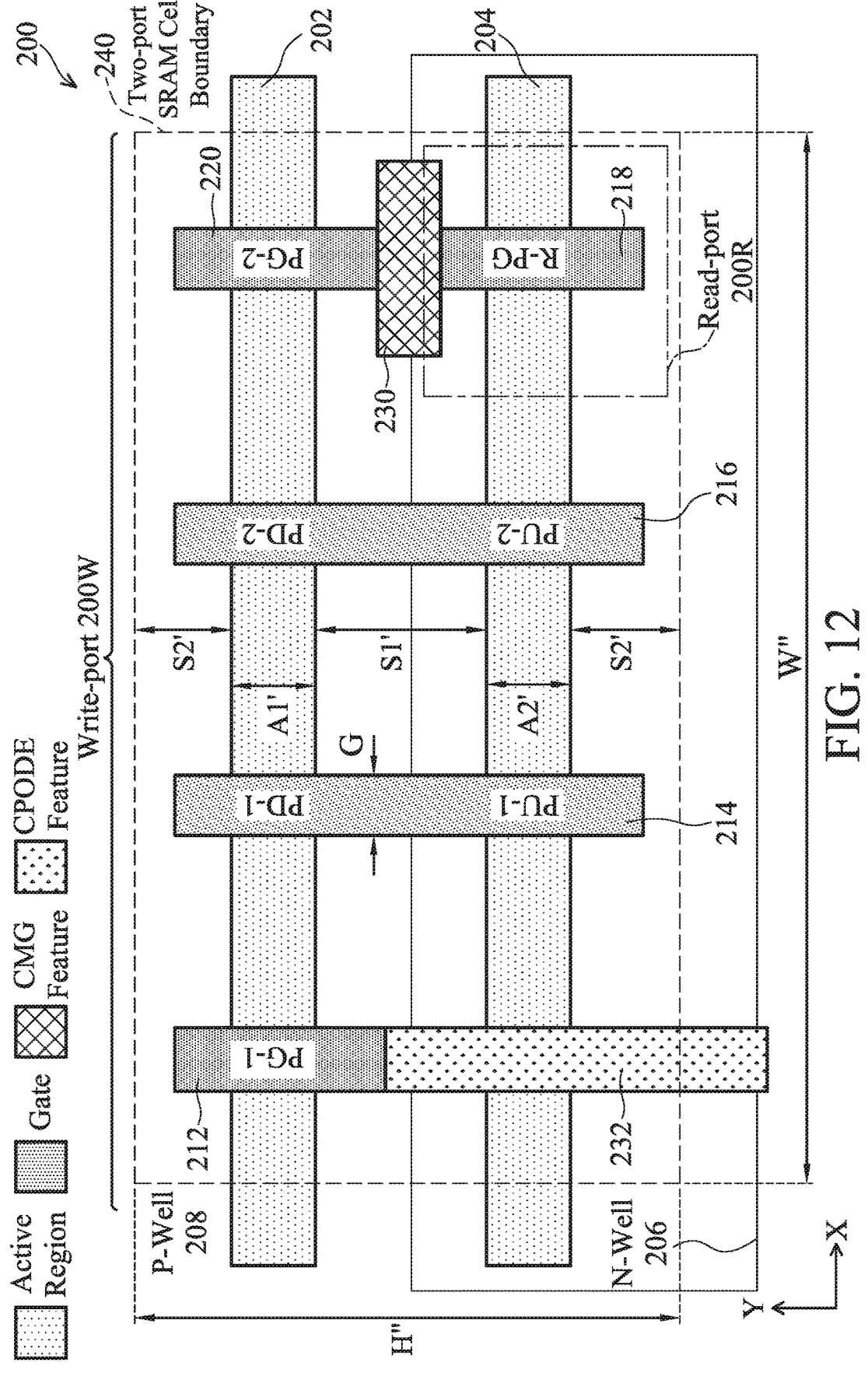
FIGS. 12 and 13 illustrate top views of the two-port SRAM cell as in FIG. 11, in accordance with some embodiments of the present disclosure.

FIG. 12 illustrates a simplified diagrammatic top view of the two-port SRAM cell 200, which includes the write-port 200W and the read-port 200R. The write-port 200W includes the transistors PG-1, PG-2, PU-1, PU-2, PD-1, and PD-2. The read-port 200R includes the transistor R-PG. For reasons of visual clarity and simplicity, the active regions and the gate structures of these transistors, together with some gate-cut features, are shown in FIG. 12, while the interconnection components such as contacts, vias, and metal lines are omitted from FIG. 12.

As shown in FIG. 12, the two-port SRAM cell 200 includes active regions 202 and 204. The active regions 202, 204 each extend lengthwise in the X-direction in FIG. 12. In the illustrated embodiment, the active regions 202, 204 may each include (or may be implemented as) the nanostructures 26 of FIG. 2 discussed above. In other embodiments, the active regions 202, 204 may include fin structures as well. The active region 202 are a components of the write-port 200W, and the active region 204 has a side portion as a component of the read-port 200R and rest portion as a component of the write-port 200W. In other words, the active region 204 is shared by the read-port 200R and the write-port 200W. In the illustrated embodiment, the active region 204 belong to the transistors PU-1, PU-2, R-PG, which are PMOS devices. As such, the active region 204 is formed over an N-well 206. Meanwhile, the active region 202 belongs to the transistors PG-1, PD-1, PD-2, PG-2, which are NMOS devices. As such, the active region 202 is formed over a P-well 208 (or a P-type substrate).

As shown in FIG. 12, the two-port SRAM cell 200 further includes gate structures 212, 214, 216, 218, and 220. The gate structures 212-220 each extend lengthwise in the Y-direction in FIG. 12. The gate structures 212-220 may each include (or may be implemented as) the gate structures 20 of FIG. 2 discussed above. The gate structures 212, 214, 216, and 220 are components of the write-port 200W. The gate structure 218 is a component of the read-port 200R. The gate structures 214, 216 each extend through the two active regions 202, 204. As such, the gate structure 214 is shared by the transistors PD-1 and PU-1, and the gate structure 216 is shared by the transistors PD-2 and PU-2.

Still referring to FIG. 12, the two-port SRAM cell 200 further includes a plurality of gate-cut dielectric features, including a CMG feature 230 extending lengthwise along the X-direction and a continuous-poly-on-diffusion-edge (CPODE) feature 232 extending lengthwise along the Y-direction. In the illustrated embodiment, the CMG feature 230 is disposed between the active regions 202, 204 and abuts the gate structure 218 and the gate structure 220. The CMG feature 230 divides an otherwise continuous gate structure into two isolated segments corresponding to the gate structure 218 and the gate structure 220.

The CPODE feature 232 is formed in a CPODE process. For purposes of this disclosure, a "diffusion edge" may be equivalently referred to as an active edge, where for example an active edge abuts adjacent active regions. Before the CPODE process, the active edge may include a dummy GAA structure having a dummy gate structure (e.g., a polysilicon gate) and a plurality of vertically stacked nanostructures as channel layers. In addition, inner spacers may be disposed between adjacent nanostructures at lateral ends of the nanostructures. In various examples, source/drain epitaxial features are disposed on either side of the dummy GAA structure, such that the adjacent source/drain epitaxial features are in contact with the inner spacers and nanostructures of the dummy GAA structure. The subsequent CPODE etching process removes the dummy gate structure and the channel layers from the dummy GAA structure to form a CPODE trench. The dielectric material filling a CPODE trench for isolation is referred to as a CPODE feature. In some embodiments, after the CPODE features are formed, the remaining dummy gate structures are replaced by metal gate structures in a replacement gate (gate-last) process. State differently, in some embodiments, the CPODE feature replaces a portion of the otherwise continuous gate structure and is confined between the opposing gate spacers of the replaced portion of the gate structure. As a comparison, the CMG feature truncates the otherwise continuous gate structure and extends into adjacent areas of the gate structure. In FIG. 12, the CPODE feature 232 abuts the gate structure 212 and is aligned with the gate structure 212. The CPODE feature 232 extends along the Y-direction and across the N-well 206 into another P-well 208 of an adjacent SRAM cell. That is, two adjacent SRAM cells may share the CPODE feature 232. Further, the CPODE feature 232 may extend downwardly deeper into the underneath substrate than the CMG feature 230, in some embodiments.

Still referring to FIG. 12, a boundary 240 of the two-port SRAM cell 200 is illustrated in FIG. 12 using broken lines. Note that some of the active regions and gate structures may extend beyond the illustrated boundary 240, since these active regions and gate structures may also form components of other adjacently located SRAM cells as well. The boundary 240 is longer in the X-direction than in the Y-direction. In other words, the boundary 240 may be rectangular. The first dimension of the boundary 240 along the X-direction is denoted as a cell width W", and the second dimension of the boundary 240 along the Y-direction is denoted as a cell height H". Where the two-port SRAM cell 200 is repeated in a memory array, the cell width W" may represent and be referred to as a memory cell pitch in the memory array along the X-direction, and the cell height H" may represent and be referred to as a memory cell pitch in the memory array along the Y-direction.

The cell size of the two-port SRAM cell 200 is W"×H", in which the cell width W" is about 4 times a poly pitch (e.g., a center-to-center distance between two adjacent gate structures along the X-direction) and the cell height H" is about 2 times an isolation pitch (e.g., a center-to-center distance between two adjacent STI features along the Y-direction). Denoting an area of one poly pitch times one isolation pitch as a unit area, each unit area includes an intersection of a gate structure and an active region, and the two-port SRAM cell 200 utilizes a cell size of about 8 times a unit area in accommodating the seven transistors, namely the transistors PG-1, PG-2, PU-1, PU-2, PD-1, PD-2, and R-PG. The area utilization rate is higher than that of the two-port SRAM cell 50. This is because there is only one unit area not utilized for forming a functional transistor but hosting an intersection of a CPODE feature and an active region instead. In some embodiments, the SRAM cell 200 has a cell size about 20% to about 33% smaller than a cell size of the SRAM cell 50.

FIG. 12 also illustrates dimensions of some features in the layout of the SRAM cell 200. The active region 202 has a width denoted as A1', the active region 204 has a width denoted as A2', each of the gate structures 212-220 has a critical dimension (CD) or gate width denoted as G. A distance (along the Y-direction) between opposing edges of the active regions 202, 204 is denoted as S1'. A distance (along the Y-direction) between an edge of the active region 202 or 204 and a respective closest edge of the boundary 240 is denoted as S2'. Therefore, the cell height H" of the SRAM cell 200 is A1'+A2'+S1'+2×S2'. In some embodiments, G ranges from about 10 nm to about 20 nm; A1' ranges from about 11 nm to about 35 nm; A2' ranges from about 11 nm to about 35 nm; and S1' ranges from about 30 nm to about 80 nm. A ratio between A2' and A1' (A2'/A1') ranges from about 0.3 to about 3.5. This range is not trivial, as if A2'/A1' is less than about 0.3, the PMOS resistance may become too large and limit the read port speed; if A2'/A1' is larger than about 3.5, the NMOS resistance may become too large and limit the write port speed. In some embodiments, A2' is larger than A1' (A2'>A1') to better accommodate PMOS read port speed needs. In some embodiments, A2' is smaller than A1' (A2'<A1') to better accommodate NMOS write port speed needs. In some embodiments, A2' equals A1' (A2'=A1') for the active regions to extend to the standard (logic) cell region to form continuous active regions across an SRAM cell region and a standard (logic) cell region. In some embodiments, S2' equals or larger than half of the S1' (S2'>0.5S1'). This range is not trivial, as if S2' is smaller than 0.5×S1', the active regions 202, 204 become too close to adjacent active regions in a neighboring SRAM cell, and process window may be so limited that overlay errors may occur. In some embodiments, a ratio between A1' and G (A1'/G) ranges from about 0.5 to about 4. This range is not trivial, as if A1'/G is less than about 0.5, the NMOS resistance may become too large and limit the write port speed; if A1'/G is larger than about 4, the active region 202 becomes too wide, and the SRAM cell area may become unnecessarily large and increase manufacturing costs. In some embodiments, a ratio between A2' and G (A2'/G) ranges from about 0.5 to about 4. This range is not trivial, as if A2'/G is less than about 0.5, the PMOS resistance may become too large and limit the read port speed; if A2'/G is larger than about 4, the active region 204 become too wide, and the SRAM cell area may become unnecessarily large and increase manufacturing costs. In some embodiments, a ratio between S1' and G (S1'/G) ranges from about 1 to about 12. This range is not trivial, as if S1'/G is less than about 1, the distance between the active regions 202, 204 may become too close and isolation performance may become poor and device performance may deteriorate; if S1'/G is larger than about 12, the distance between active regions 202, 204 may become too wide, and the SRAM cell area may become unnecessarily large and increase manufacturing costs.

Figure 13:
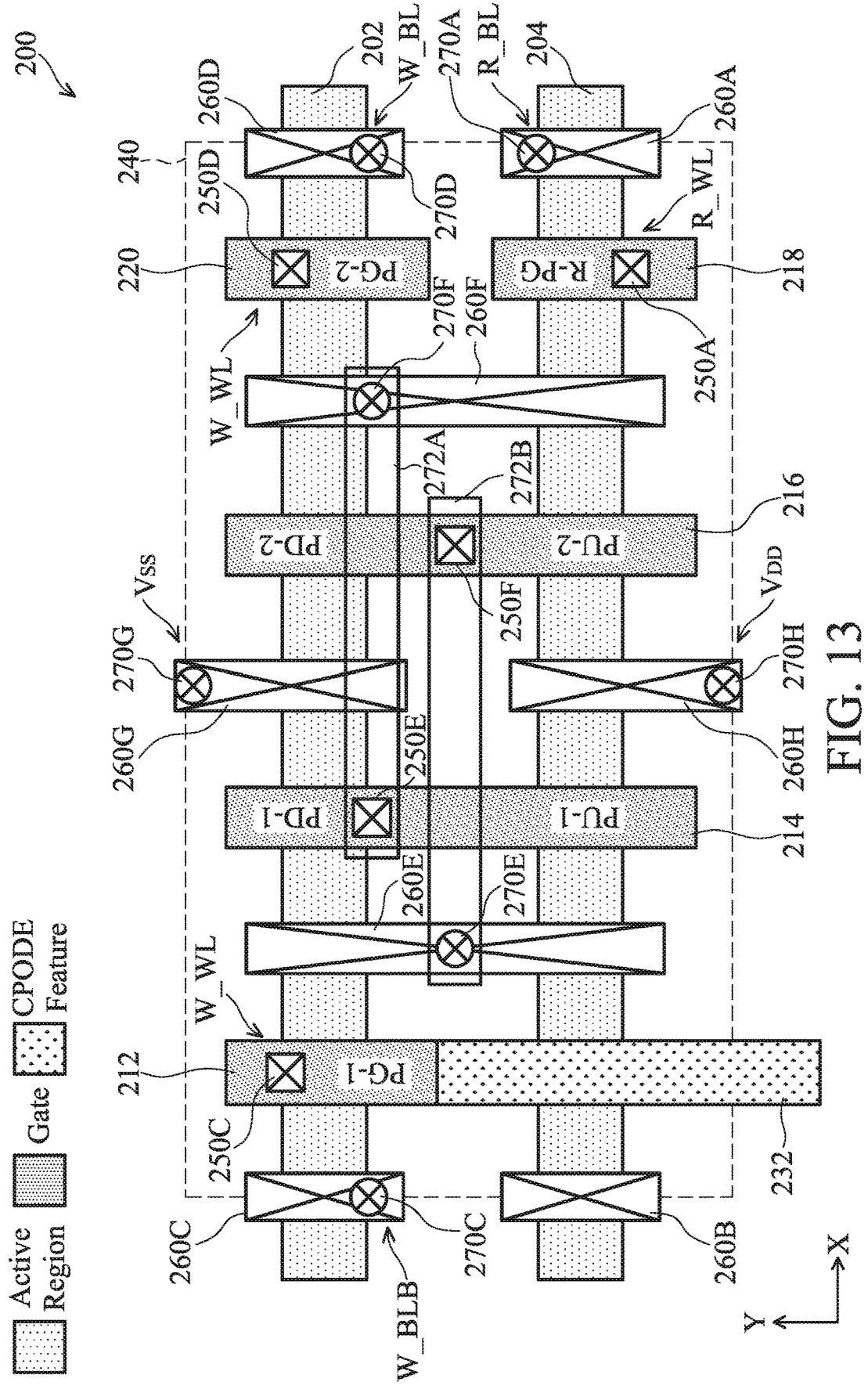

FIG. 13 illustrates conductive features of the two-port SRAM cell 200 in the contact level and the V0 level. The active regions 202-204, the gate structures 212-220, the CPODE feature 232, and the cell boundary 240 illustrated in FIG. 12 are reproduced in FIG. 13, while other features (such as well regions, CMG features, etc.) are omitted from FIG. 13 for reasons of visual clarity and simplicity.

A gate contact 250A electrically connects a gate of the read-port pass-gate transistor R-PG (formed by the gate structure 218) to the read-port word line R_WL. A gate contact 250C electrically connects a gate of the write-port pass-gate transistor PG-1 (formed by the gate structure 212) to the write-port word line W_WL. A gate contact 250D electrically connects a gate of the write-port pass-gate transistor PG-2 (formed by the gate structure 220) to the write-port word line W_WL. A gate contact 250E electrically connects a gate of the write-port pull-down transistor PD-1 (formed by the gate structure 214) and a gate of the write-port pull-up transistor PU-1 (also formed by the gate structure 214) to the storage node SN. A gate contact 250F electrically connects a gate of the write-port pull-down transistor PD-2 (formed by the gate structure 216) and a gate of the write-port pull-up transistor PU-2 (also formed by the gate structure 216) to the complementary storage node SNB.

A source/drain contact 260A and a source/drain contact via 270A landing thereon electrically connect a source region of the read-port pass-gate transistor R-PG to the read-port bit line R_BL. A source/drain contact 260B lands on a source/drain region adjacent to the CPODE feature 232 and stays electrically floating, as there is no corresponding source/drain contact via landing thereon. A source/drain contact 260C and a source/drain contact via 270C landing thereon electrically connect a source region of the write-port pass-gate transistor PG-1 to the write-port complementary bit line W_BLB. A source/drain contact 260D and a source/drain contact via 270D landing thereon electrically connect a source region of the write-port pass-gate transistor PG-2 to the write-port bit line W_BL. A source/drain contact 260E and a source/drain contact via 270E landing thereon electrically connect a common drain region of the write-port pass-gate transistor PG-1 and the write-port pull-down transistor PD-1 together with a drain region of the write-port pull-up transistor PU-1 to the complementary storage node SNB. A source/drain contact 260F and a source/drain contact via 270F landing thereon electrically connect a common drain region of the write-port pass-gate transistor PG-2 and the write-port pull-down transistor PD-2 together with a common drain region of the write-port pull-up transistor PU-2 and the read-port pass-gate transistor R-PG to the storage node SN. A source/drain contact 260G and a source/drain contact via 270G landing thereon electrically connect a common source region of the write-port pull-down transistor PD-1 and the write-port pull-down transistor PD-2 to the voltage node Vss. A source/drain contact 260H and a source/drain contact via 270H landing thereon electrically connect a common source region of the write-port pull-up transistor PU-1 and the write-port pull-up transistor PU-2 to the voltage node VDD.

To illustrate the connection between the gates of the transistors PD-1, PU-1 and the common drain region of the transistors PG-2, PD-2, PU-2, R-PG as the storage node SN, FIG. 13 further illustrates an M0 metal line 272A at the M0 level. The M0 metal line 272A extends in the X-direction and connects the gate contact 250E and the source/drain contact via 270F. Since the gate contact 250E and the source/drain contact via 270F are separated by the gate structure 216 therebetween, the M0 metal line 272A hangs over the gate structure 216 and provide the function of cross coupling. This is one of the signature features in the layout of the SRAM cell 200, as butted contact is not applicable due to the insertion of the gate structure 216. To illustrate the connection between the gates of the transistors PD-2, PU-2 and the common drain region of the transistors PG-1, PD-1, PU-1 as the complementary storage node SNB, FIG. 13 further illustrates an M0 metal line 272B at the M0 level. The M0 metal line 272B extends in the X-direction and connects the gate contact 250F and the source/drain contact via 270E. Since the gate contact 250F and the source/drain contact via 270E are separated by the gate structure 214 therebetween, the M0 metal line 272B hangs over the gate structure 214 and provide the function of cross coupling.

This is one of the signature features in the layout of the SRAM cell 200, as butted contact is not applicable due to the insertion of the gate structure 214. To be noticed, there are other M0 metal lines in the layout of the SRAM cell 200 but omitted in FIG. 13 for reasons of visual clarity and simplicity.

Figure 14:
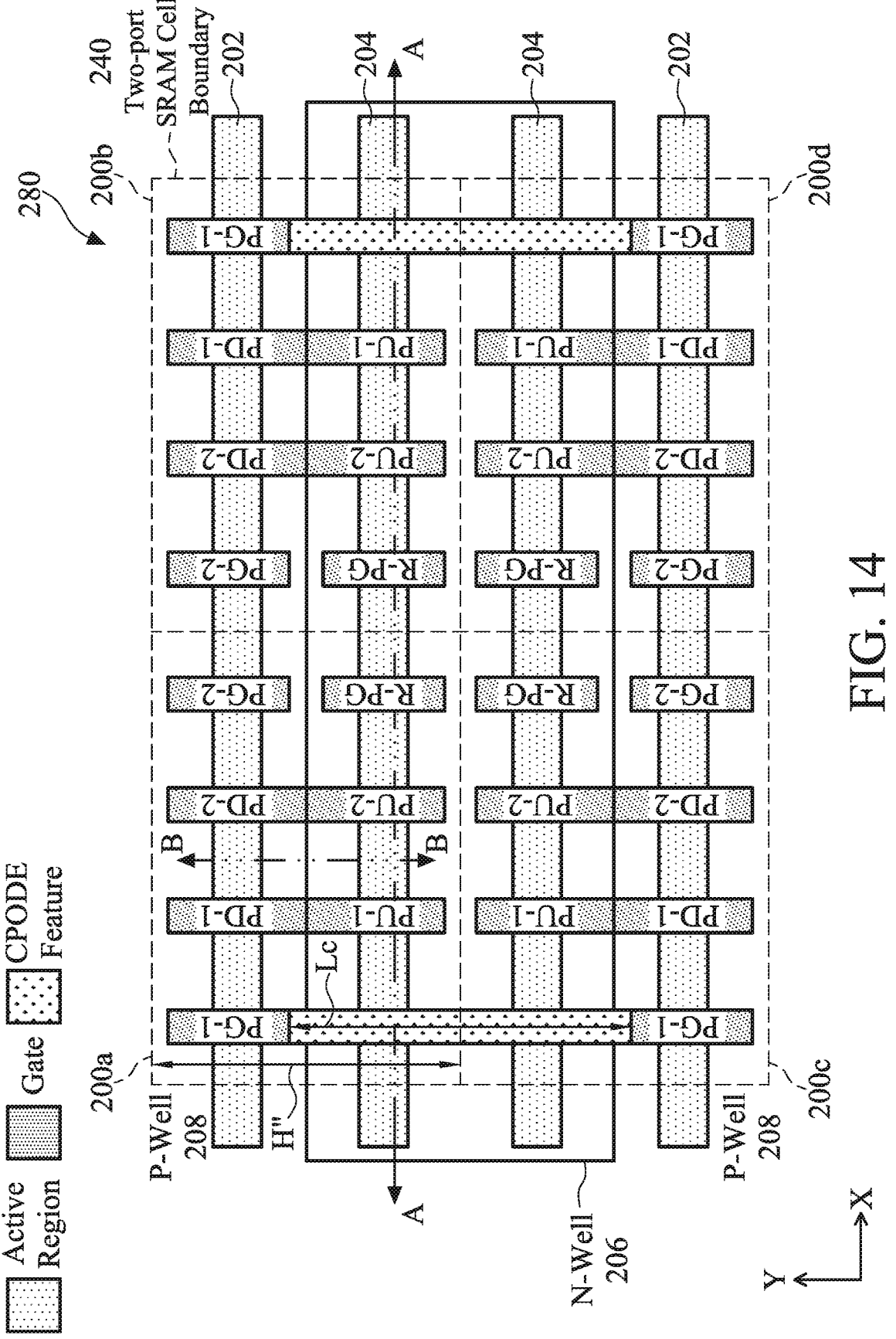
FIGS. 14 and 15 illustrate top views of an SRAM array based on the two-port SRAM cell as in FIG. 11, in accordance with some embodiments of the present disclosure.

FIG. 14 illustrates a layout of an SRAM array 280 according to the present disclosure. Referring to FIG. 14, a plurality of two-port SRAM cells 200a, 200b, 200c, and 200d are arranged in the X-direction and the Y-direction, forming a 2×2 array of SRAM cells. Each SRAM cell in the array may use the layout of the SRAM cell 200 as depicted in FIG. 12. In some embodiments, two adjacent SRAM cells in the X-direction are line symmetric with respect to a common boundary therebetween, and two adjacent SRAM cells in the Y-direction are line symmetric with respect to a common boundary therebetween. That is, the SRAM cell 200b is a duplicate cell for the SRAM cell 200a but flipped over the Y-axis; the SRAM cell 200c is a duplicate cell for the SRAM cell 200a but flipped over the X-axis; and the SRAM cell 200d is a duplicate cell for the SRAM cell 200b but flipped over the X-axis. FIG. 14 has been simplified for the sake of clarity to better understand the inventive concepts of the present disclosure. For example, active regions, gate structures, CPODE features, N-well, P-well, and cell boundaries for shown, while some other features are omitted in FIG. 14.

The SRAM array 280 includes well regions 206 and 208 alternately arranged along the Y-axis. In other words, every P-well region 208 is next to an N-well region 206 which is next to another P-well region 208, and this pattern repeats. In the illustrated embodiment as in FIG. 14, the gate structures in each two-port SRAM cells do not extend beyond the respective cell boundary, and each CPODE feature is shared by two neighboring SRAM cells arranged in the Y-direction. The distance along the X-direction between adjacent CPODE features (also denoted as CPODE-to-CPODE pitch) is 7 times a poly pitch. A length of the CPODE feature along the Y-direction is denoted as Lc. A ratio of Lc and the SRAM cell height H" (Lc/H") ranges from about 0.5 to about 1.5. This range is not trivial, as if Lc/H" is less than about 0.5, the CPODE feature is not sufficiently long and residues of a dummy gate structure (e.g., a polysilicon gate) may remain; if Lc/H" is larger than about 1.5, the CPODE feature may takes too much space, and the gate structures abut the two ends of the CPODE feature may become too short.

Figure 15:
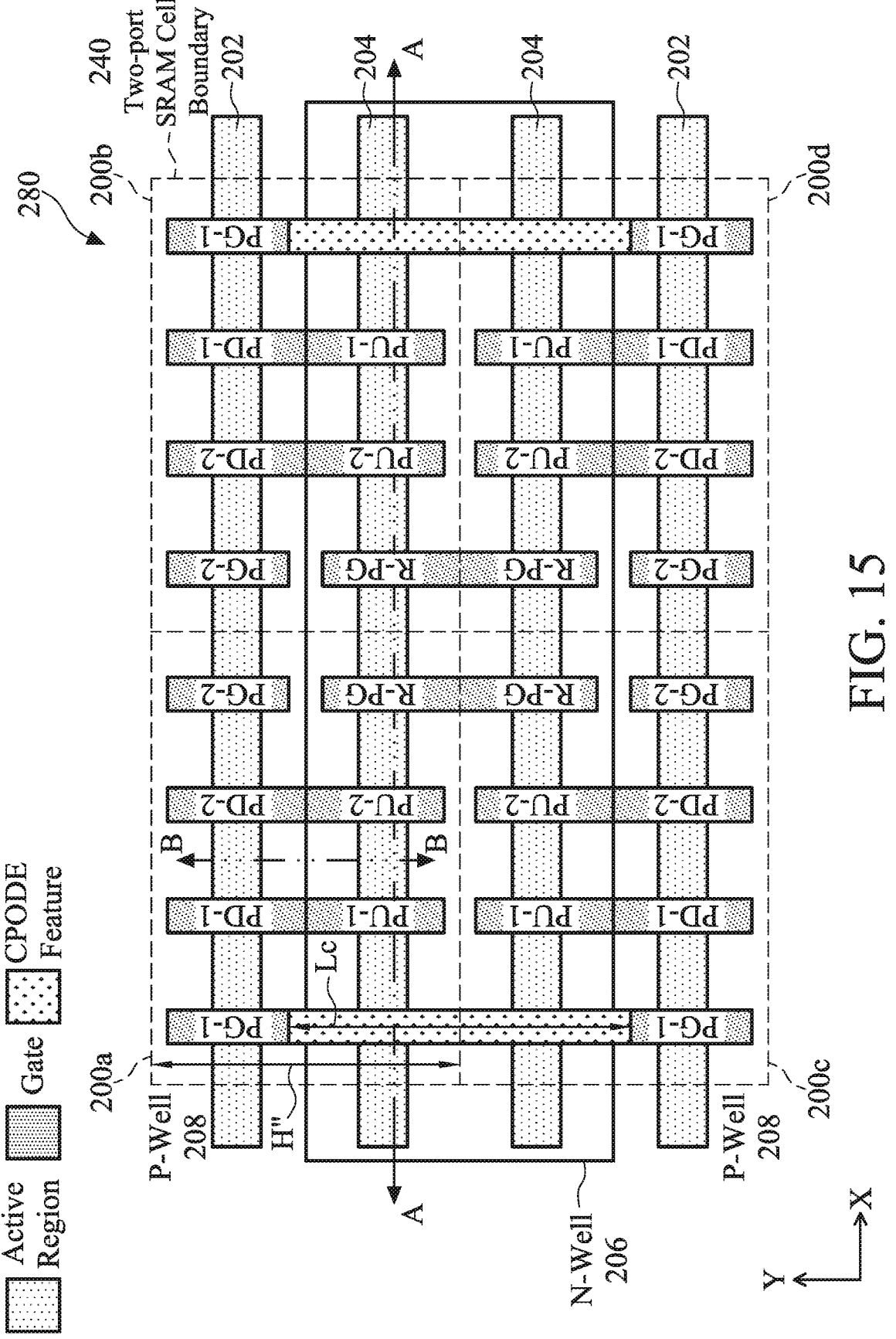

In some embodiments, some gate structures may be shared by neighboring SRAM cells, such that these gate structures extend lengthwise across the boundary between neighboring SRAM cells. FIG. 15 illustrates such an alternative embodiment. Referring to FIG. 15, the transistor R-PG in the SRAM cell 200a and the transistor R-PG in the SRAM cell 200c share the same gate structure, which extends lengthwise across the boundary between the SRAM cells 200a and 200c; and the transistor R-PG in the SRAM cell 200b and the transistor R-PG in the SRAM cell 200d shares the same gate structure, which extends lengthwise across the boundary between the SRAM cells 200b and 200d.

Figure 16A:
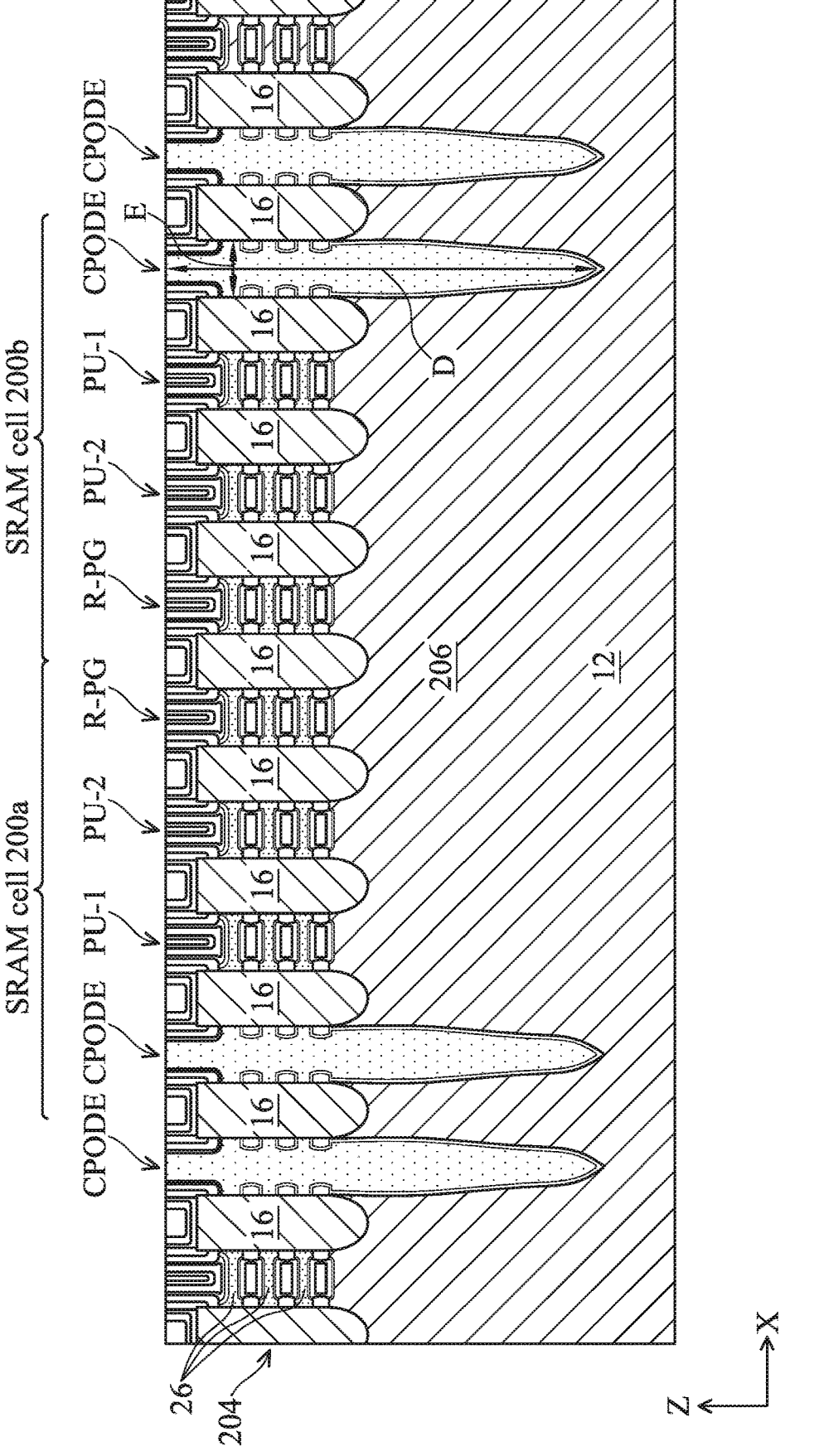

FIG. 16A is a fragmentary diagrammatic cross-sectional view along A-A line of FIG. 14 (or FIG. 15), which cuts the active region 204 along its lengthwise direction, according to various aspects of the present disclosure. FIG. 16B is a fragmentary diagrammatic cross-sectional view along B-B line of FIG. 14 (or FIG. 15), which cuts source/drain regions along a middle line of the SRAM cell 200a, according to various aspects of the present disclosure. Referring to FIGS. 16A and 16B collectively, the active region 204 extends through the SRAM cells 200a, 200b but sandwiched by the CPODE feature in the SRAM cell 200a and the CPODE feature in the SRAM cell 200b. The CPODE features replace the otherwise metal gate structures closest to the cell edges. The distance between the CPODE feature in the SRAM cell 200a and the CPODE feature in the SRAM cell 200b (CPODE-to-CPODE pitch) is 7 times a poly pitch. To better illustrate the arrangement of the CPODE features, an extra CPODE feature in an SRAM cell laid to the left of the SRAM cell 200a and an extra CPODE feature in an SRAM cell laid to the right of the SRAM cell 200b along the X-direction are also depicted in FIG. 16A.

Also as shown in the cross-sectional view, the CPODE feature has a width denoted as E and a depth denoted as D. In some embodiments, the CPODE width E ranges from about 15 nm to about 20 nm; the CPODE depth D ranges from about 150 nm to about 250 nm. A ratio between the CPODE width E and the gate width G (E/G) may range from about 0.5 to about 2. This range is not trivial, as if E/G is less than about 0.5, the CPODE feature is too narrow and residues of a dummy gate structure (e.g., a polysilicon gate) may remain; if E/G is larger than about 2, the CPODE feature is too wide and etch into adjacent functional features. A ratio between the CPODE depth D and G (D/G) may range from about 10 and about 15. This range is not trivial, as if D/G is less than about 10, the CPODE feature is too shallow and the isolation performance is compromised; if D/G is larger than about 15, an over etching for forming a deep CPODE trench may also laterally erode adjacent functional features.

Between the CPODE feature in the SRAM cell 200a and the CPODE feature in the SRAM cell 200b, the active region 204 includes channel regions that is comprised of the nanostructures 26 and source/drain features 16 abut the ends of the nanostructures 26. The gate structures wrap around the nanostructures 26 and form the transistors PU-1, PU-2, R-PG in the SRAM cell 200a and the transistors R-PG, PU-2, PU-1 in the SRAM cell 200b. The active region 204 is disposed over the N-well 206, and the active region 202 is disposed over the P-well 208. The source/drain features 16 formed on the active region 204 is p-type epitaxial features, and the source/drain features 16 formed on the active region 202 is n-type epitaxial features. The source/drain contact 260H electrically connects to the source/drain features 16 formed on the active region 204, and the source/drain contact 260G electrically connects to the source/drain features 16 formed on the active region 202.

Figure 17:
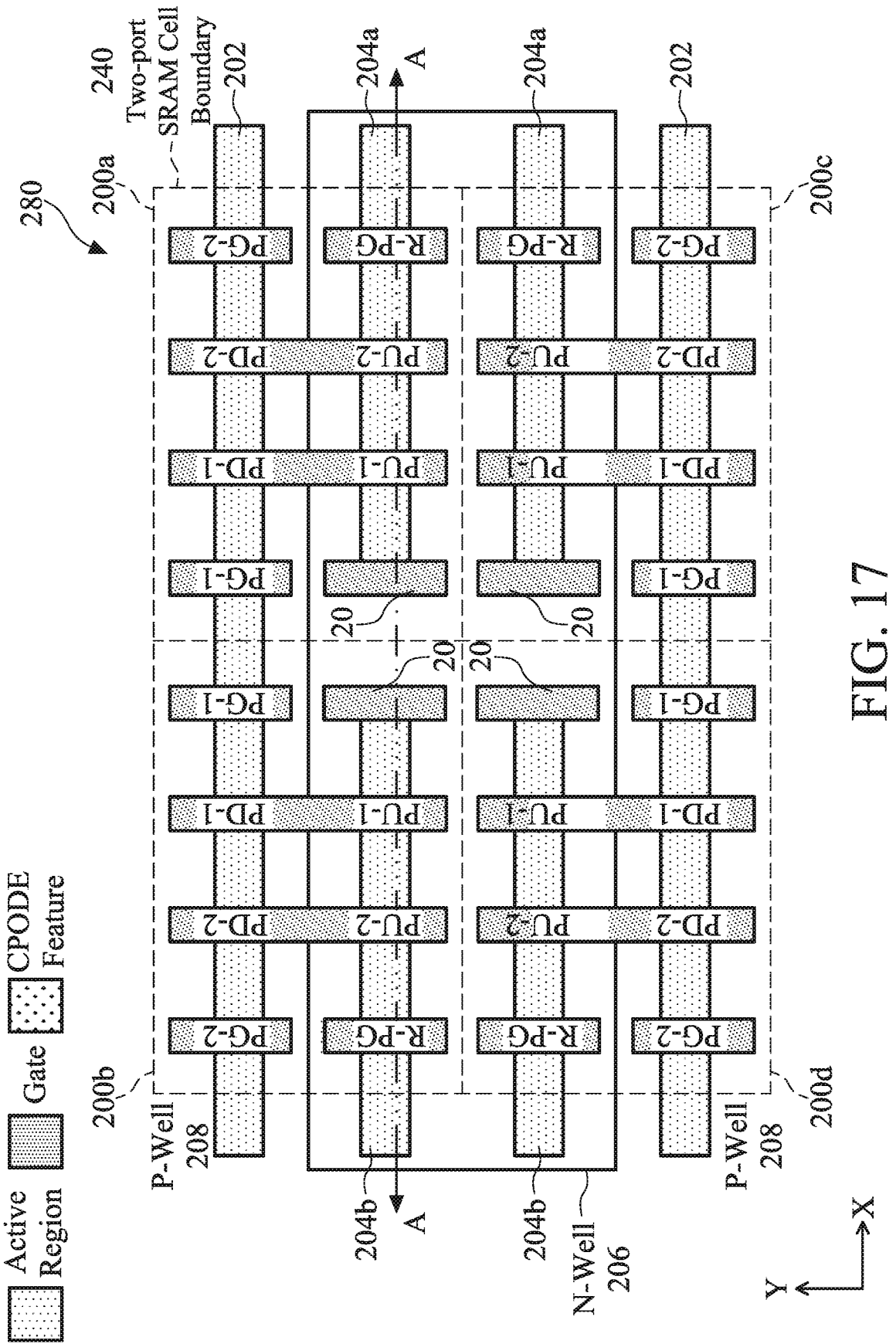
FIGS. 17 and 18 illustrate top views of an SRAM array based on the two-port SRAM cell as in FIG. 11, in accordance with some other embodiments of the present disclosure.

FIG. 17 illustrates an alternative layout of the SRAM array 280 according to the present disclosure. Referring to FIG. 17, a plurality of two-port SRAM cells 200a, 200b, 200c, and 200d are arranged in the X-direction and the Y-direction, forming a 2×2 array of SRAM cells. Each SRAM cell in the array may use the layout of the SRAM cell 200 as depicted in FIG. 12. In some embodiments, two adjacent SRAM cells in the X-direction are line symmetric with respect to a common boundary therebetween, and two adjacent SRAM cells in the Y-direction are line symmetric with respect to a common boundary therebetween. That is, the SRAM cell 200b is a duplicate cell for the SRAM cell 200a but flipped over the Y-axis; the SRAM cell 200c is a duplicate cell for the SRAM cell 200a but flipped over the X-axis; and the SRAM cell 200d is a duplicate cell for the SRAM cell 200b but flipped over the X-axis. FIG. 17 has been simplified for the sake of clarity to better understand the inventive concepts of the present disclosure. For example, active regions, gate structures, N-well, P-well, and cell boundaries for shown, while some other features are omitted in FIG. 17.

Compared with the layout as depicted in FIG. 14, one difference is that in FIG. 17, there is no CPODE features. Instead, the otherwise continuous active region 204 is patterned by a cut-active-region process into two separated active regions 204a. 204b. Metal gate structures 20 are deposited at the ends of the active regions 204a, 204b. Since the active regions 204a, 204b are disconnected, the transistors formed at the intersection of the metal gate structures 20 and the ends of the active regions 204a, 204b are non-functional transistors. The number of functional transistors in a single SRAM cell 200 is still seven.

In the present embodiment, the unwanted portion of the active region may be removed by a cut-active-region process that includes a lithography process and an etching process. For example, after the continuous action regions 202, 204 are formed by patterning a top portion of the substrate, a photoresist layer is formed thereon using a spin-coating process and a soft baking process. Then, the photoresist layer is exposed to a radiation using a mask. The exposed photoresist layer is subsequently developed and stripped thereby forming a patterned photoresist layer. The portions of the continuous active region 204 corresponding to the segmented active regions 204a, 204b are protected by the patterned photoresist layer while the unwanted portion therebetween is not protected as such. Subsequently, the unwanted portion is etched through the opening of the patterned photoresist layer. The patterned photoresist layer is removed thereafter using a suitable process, such as wet stripping or plasma ashing. An isolation feature, such as the isolation structure 18, is subsequently deposited in the gap between the segmented active regions 204a, 204b. Thus, the isolation between active regions is provided by the isolation structure 18 (e.g., an STI feature) other than the CPODE features, which may better safeguard the substrate leakage performance if under etching occurs during the CPODE formation.

Figure 18:
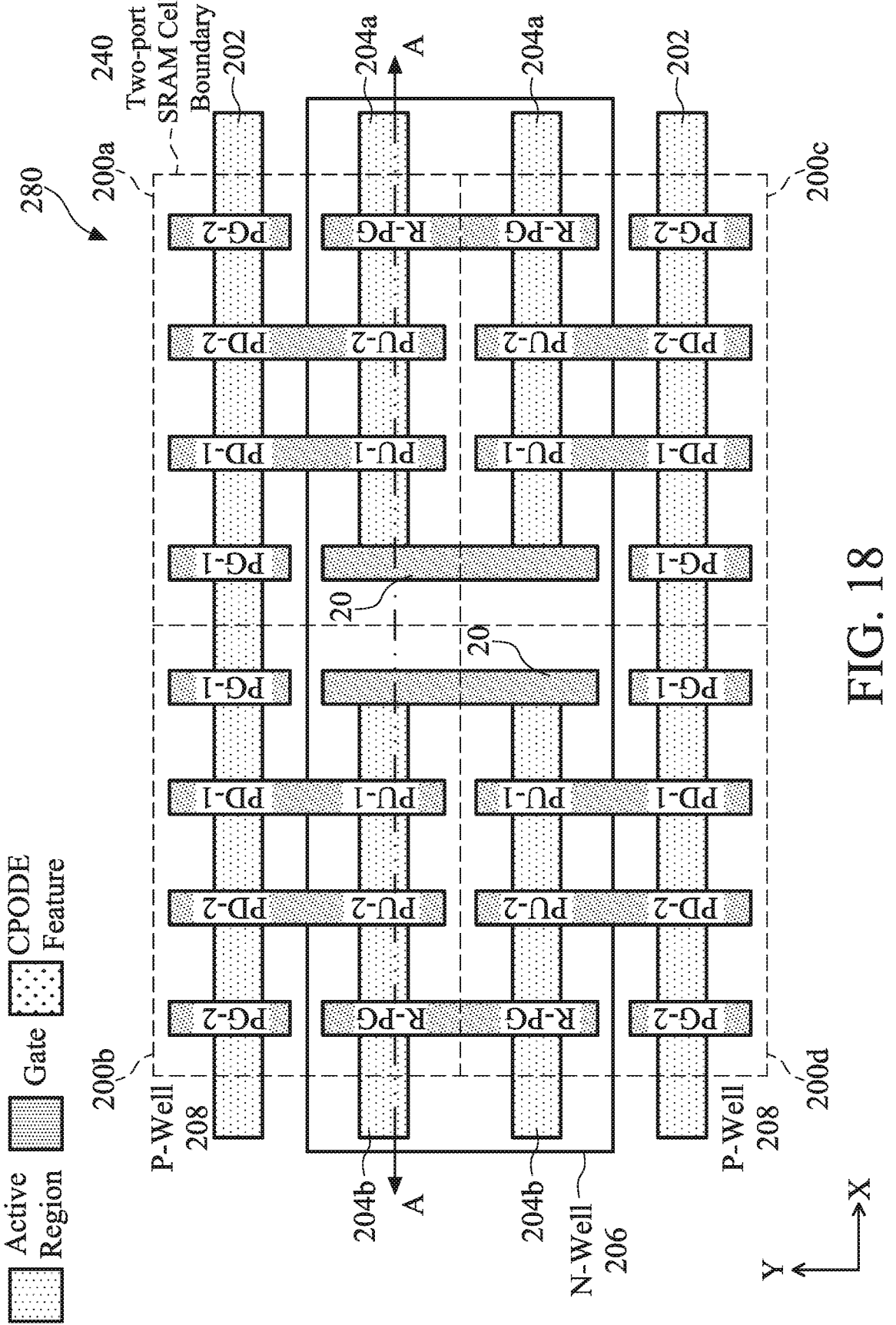

In some embodiments, some gate structures may be shared by neighboring SRAM cells, such that these gate structures extend lengthwise across the boundary between neighboring SRAM cells. FIG. 18 illustrates such an alternative embodiment. Referring to FIG. 18, the transistor R-PG in the SRAM cell 200a and the transistor R-PG in the SRAM cell 200c share the same gate structure, which extends lengthwise across the boundary between the SRAM cells 200a and 200c; the transistor R-PG in the SRAM cell 200b and the transistor R-PG in the SRAM cell 200d shares the same gate structure, which extends lengthwise across the boundary between the SRAM cells 200b and 200d; the non-functional transistors in the SRAM cells 200a, 200c share the gate structure 20 disposed at the ends of the active regions 204a, which extends lengthwise across the boundary between the SRAM cells 200a, 200c; and the non-functional transistors in the SRAM cells 200b, 200d share the gate structure 20 disposed at the ends of the active regions 204b, which extends lengthwise across the boundary between the SRAM cells 200b, 200d.

Figure 19A:
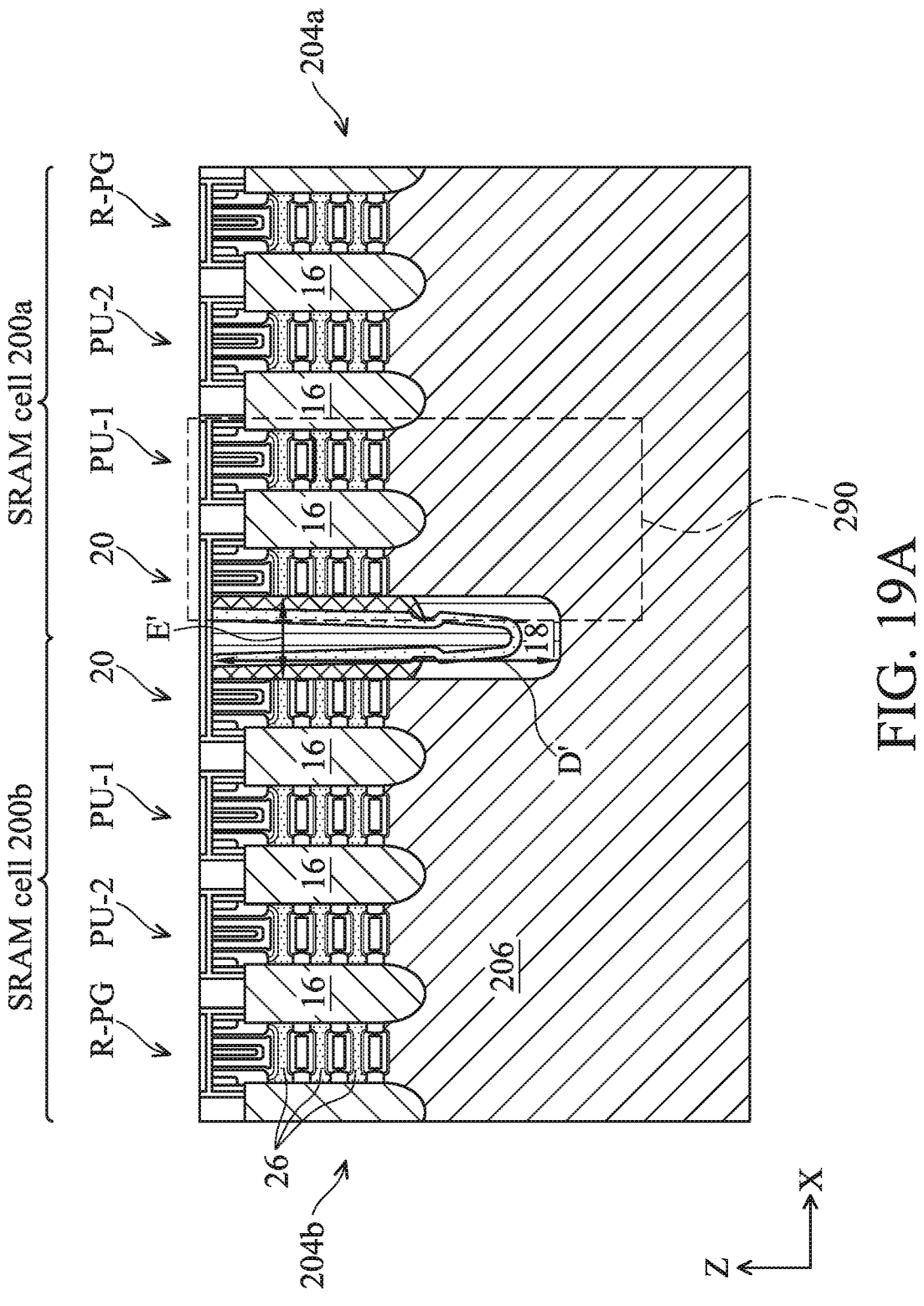
FIGS. 19A and 19B illustrate cross-sectional views of portions of the SRAM array as in FIG. 17 or FIG. 18, in accordance with some embodiments of the present disclosure.
Figure 19B:
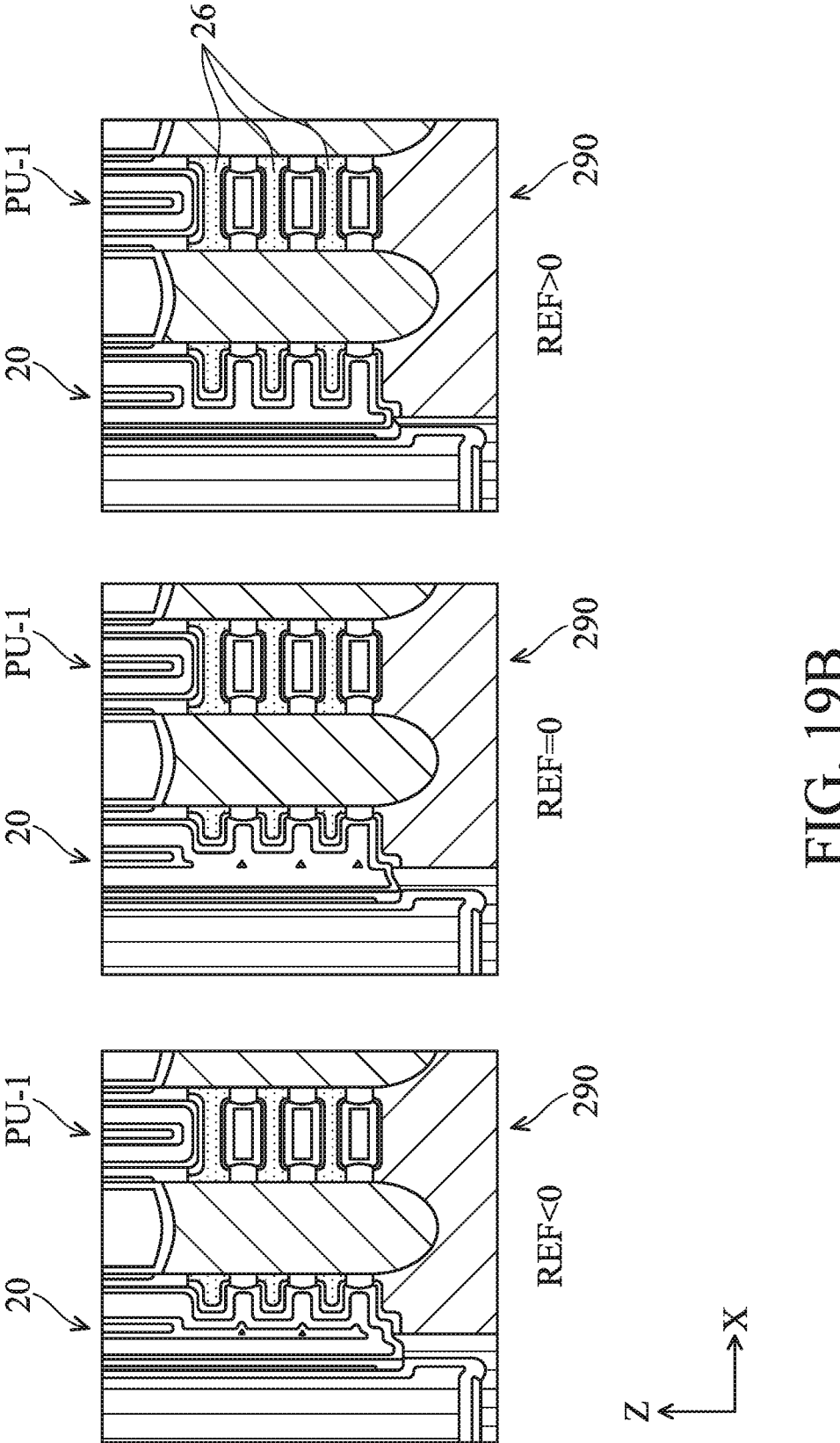

FIG. 19A is a fragmentary diagrammatic cross-sectional view along A-A line of FIG. 17 (or FIG. 18), which cuts the active regions 204a, 204b along the X-direction, according to various aspects of the present disclosure. FIG. 19B illustrated a region 290 in FIG. 19A when overlay shift in the X-direction occurs between the gate structures 20 and a centerline of the isolation structure 18 (e.g., STI feature). The distance between opposing edges of the active regions 204a, 204b is denoted as E', and depth of the isolation structure 18 is denoted as D'. In some embodiments, E' ranges from about 40 nm to about 60 nm, and D' ranges from about 90 nm to about 180 nm. A ratio between E' and the gate width G (E'/G) may range from about 1 to about 4. This range is not trivial, as if E'/G is less than about 1, the active region may extend from the metal gate and the non-functional transistor may not be completely disable; if E'/G is larger than about 4, the cut into the active region may be too wide and damage the gate structures of adjacent functional transistors. A ratio between D' and the gate width G (D'/G) may range from about 6 to about 13. This range is not trivial, as if D'/G is smaller than about 6, the cut is not deep enough, and the isolation performance may be compromised; if D'/G is larger than about 13, an over etching for forming a deep trench may also laterally erode adjacent functional features. In FIG. 19B, "REF=0" represents that no overlay shift occurs, "REF<0" represents that with respect to a centerline of the isolation structure 18 the gate structure 20 shifts to the negative direction along the X-direction, and "REF>0" represents that with respect to a centerline of the isolation structure 18 the gate structure 20 shifts to the positive direction along the X-direction. In some embodiments, in a range of −4 nm to +3 nm overlay shifts, the STI sidewall thickness may vary about 6 nm. Therefore, a thickness of the isolation features 18 disposed on edges of the segmented active region need to spare a 6 nm margin. With the extent of overlay shift, the metal layers in the gate structure 20 as disposed on the edges of the segmented active region may vary as well, which are illustrated in detail in the cross-sectional views associated with the illustration of overlay shifts. For example, under "REF>0", the glue layer and metal fill layer of the gate structure 20 may not fill in the relatively narrow gate trench and remain above a topmost nanostructure 26; under "REF<0", the glue layer and metal fill layer of the gate structure 20 may fill into the relatively wide gate trench and extend under the bottommost nanostructure 26.

The multi-port SRAM cell and the corresponding layout illustrated in various exemplary embodiments of the present disclosure provide better cell area utilization, which in turn shrinks a cell size needed to implement a multi-port SRAM cell. In some embodiments, a cell size reduction of about 20%-30% may be achieved compared to some conventional multi-port SRAM cell designs. Further, embodiments of the present disclosure can be readily integrated into existing semiconductor manufacturing processes.

In one exemplary aspect, the present disclosure is directed to a memory cell. The memory cell includes first and second active regions, each of the first and second active regions extending lengthwise in a first direction, first, second, third, and fourth gate structures arranged in order from first to fourth along the first direction, each of the first, second, third, and fourth gate structures extending lengthwise in a second direction that is perpendicular to the first direction, the first, second, third, and fourth gate structures being configured to engage the first and second active regions in forming first, second, third, fourth, fifth, and sixth transistors of a write-port of the memory cell, and a fifth gate structure, the fifth gate structure extending lengthwise in the second direction, and the fifth gate structure being configured to engage the second active region in forming a seventh transistor of a read-port of the memory cell. In some embodiments, the second active region is disposed on an n-well, and the seventh transistor is a p-type transistor. In some embodiments, the fourth gate structure is configured to engage the first active region in forming the sixth transistor, the sixth transistor is a pass-gate (PG) transistor of the write-port, and the seventh transistor is a PG transistor of the read-port. In some embodiments, the sixth transistor is an n-type transistor, and the seventh transistor is a p-type transistor. In some embodiments, the fifth gate structure is disposed on an extension line of the fourth gate structure. In some embodiments, the memory cell further includes a first dielectric feature stacked between an end of the fourth gate structure and an end of the fifth gate structure, the first dielectric feature extending lengthwise in the first direction. In some embodiments, the memory cell further includes a second dielectric feature abutting an end of the first gate structure, the second dielectric feature extending lengthwise in the second direction, and the second dielectric feature extending downwardly deeper than the first dielectric feature. In some embodiments, the read-port is a first read-port, and the memory cell further includes a sixth gate structure, the sixth gate structure extending lengthwise in the second direction, and the sixth gate structure being configured to engage the second active region in forming an eighth transistor of a second read-port of the memory cell. In some embodiments, the second active region is disposed on an n-well, and each of the seventh and eighth transistors is a p-type transistor. In some embodiments, the first gate structure is configured to engage the first active region in forming the first transistor, the first transistor is a pass-gate (PG) transistor of the write-port, and the eighth transistor is a PG transistor of the second read-port.

In another exemplary aspect, the present disclosure is directed to a semiconductor device. The semiconductor device includes a write-port of a static random-access memory (SRAM) cell and a read-port of the SRAM cell. The write-port including at least a pull-up (PU) transistor, a pull-down (PD) transistor, and a pass-gate (PG) transistor. The read-port includes a PG transistor. The PG transistor in the write-port is an n-type transistor. The PG transistor in the read-port is a p-type transistor. The PU transistor in the write-port and the PG transistor in the read-port include channel regions disposed on a first active region. The PD transistor of the write-port and the PG transistor of the write-port include channel regions disposed on a second active region. The second active region extends parallel to the first active region. In some embodiments, the read-port is a first read-port, and the semiconductor device further includes a second read-port of the SRAM cell. The second read-port includes a PG transistor, and the PG transistor in the second read-port is a p-type transistor. In some embodiments, the PG transistor in the second read-port includes a channel region disposed on the first active region. In some embodiments, the PU transistor of the write-port and the PD transistor of the write-port share a first gate structure, the PG transistor of the write-port includes a second gate structure, the PG transistor of the read-port includes a third gate structure, and the third gate structure is disposed on an extension line of the second gate structure. In some embodiments, the semiconductor device includes a gate-cut feature disposed between the second gate structure and the third gate structure and isolating the second gate structure from the third gate structure. In some embodiments, the PU transistor and the PD transistor of the write-port are a first PU transistor and a first PD transistor of the write-port, respectively. The write-port further includes a second PU transistor and a second PD transistor, the second PU transistor includes a channel region disposed on the first active region, and the second PD transistor includes a channel region disposed on the second active region.

In yet another exemplary aspect, the present disclosure is directed to a memory array. The memory array includes a first static random-access memory (SRAM) cell, the first SRAM cell including a write-port and a read-port, and the read-port of the first SRAM cell including a first pass-gate (PG) transistor, and a second SRAM cell, the second SRAM cell including a write-port and a read-port, and the read-port of the second SRAM cell including a second PG transistor, the first PG transistor and the second PG transistor sharing a first gate structure that extends across a boundary between the first SRAM cell and the second SRAM cell. In some embodiments, the memory array further includes an isolation feature extending across the boundary between the first SRAM cell and the second SRAM cell. The write-port of the first SRAM cell includes a third PG transistor, the write-port of the second SRAM cell includes a fourth PG transistor, and the isolation feature extends from an end of a gate structure of the third PG transistor to an end of a gate structure of the fourth PG transistor. In some embodiments, the first PG transistor and the second PG transistor are p-type transistors disposed on an n-well, and the n-well extends through the boundary between the first SRAM cell and the second SRAM cell. In some embodiments, the read-port of the first SRAM cell is a first read-port of the first SRAM cell, the read-port of the second SRAM cell is a first read-port of the second SRAM cell, the first SRAM cell includes a second read-port including a third PG transistor, the second SRAM cell includes a second read-port including a fourth PG transistor, and the third PG transistor and the fourth PG transistor share a second gate structure that extends across the boundary between the first SRAM cell and the second SRAM cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory array, comprising:
a first memory cell; and
a second memory cell abutting the first memory cell,
wherein each of the first and second memory cells include:
first and second active regions, wherein each of the first and second active regions extends lengthwise in a first direction;
first, second, third, and fourth gate structures arranged in order from first to fourth along the first direction, wherein each of the first, second, third, and fourth gate structures extends lengthwise in a second direction that is perpendicular to the first direction, wherein the first, second, third, and fourth gate structures are configured to engage the first and second active regions in forming first, second, third, fourth, fifth, and sixth transistors of a write-port of the memory cell; and
a fifth gate structure, wherein the fifth gate structure extends lengthwise in the second direction, and the fifth gate structure is configured to engage the second active region in forming a seventh transistor of a read-port of the memory cell, wherein the second memory cell shares the fifth gate structure with the first memory cell, wherein the seventh transistor is a pass-gate (PG) transistor of the read-port, the fifth transistor is a pull-up (PU) transistor of the write-port, and the fifth and seventh transistors share the second active region.

2. The memory cell of claim 1, wherein the second active region is disposed on an n-well, and the seventh transistor is a p-type transistor.

3. The memory cell of claim 1, wherein:

the fourth gate structure is configured to engage the first active region in forming the sixth transistor, and the sixth transistor is a PG transistor of the write-port.

4. The memory cell of claim 3, wherein the sixth transistor is an n-type transistor, and the seventh transistor is a p-type transistor.

5. The memory cell of claim 3, wherein the fifth gate structure is disposed on an extension line of the fourth gate structure.

6. The memory cell of claim 1, further comprising:

a first dielectric feature stacked between an end of the fourth gate structure and an end of the fifth gate structure, wherein the first dielectric feature extends lengthwise in the first direction.

7. The memory cell of claim 6, further comprising:

a second dielectric feature abutting an end of the first gate structure, wherein the second dielectric feature extends lengthwise in the second direction, and the second dielectric feature extends downwardly deeper than the first dielectric feature.

8. The memory cell of claim 1, wherein the read-port is a first read-port, the memory cell further comprising:

a sixth gate structure, wherein the sixth gate structure extends lengthwise in the second direction, and the sixth gate structure is configured to engage the second active region in forming an eighth transistor of a second read-port of the memory cell.

9. The memory cell of claim 8, wherein the second active region is disposed on an n-well, and each of the seventh and eighth transistors is a p-type transistor.

10. The memory cell of claim 8, wherein:

the first gate structure is configured to engage the first active region in forming the first transistor, the first transistor is a PG transistor of the write-port, and the eighth transistor is a PG transistor of the second read-port.

11. A memory array, comprising:

a first static random-access memory (SRAM) cell having a write-port and a read-port; and a second SRAM cell having a write-port and a read-port, the second SRAM cell abutting the first SRAM cell, wherein, inside the first SRAM cell:

the write-port includes at least a pull-up (PU) transistor, a pull-down (PD) transistor, and a pass-gate (PG) transistor, the read-port includes at least a PG transistor, the PG transistor in the write-port is an n-type transistor, the PG transistor in the read-port is a p-type transistor, the PU transistor in the write-port and the PG transistor in the read-port include channel regions disposed on a first active region, the PD transistor of the write-port and the PG transistor of the write-port include channel regions disposed on a second active region, and the second active region extends parallel to the first active region, wherein the PG transistor in the read-port has a gate structure extending across a boundary between the first and second SRAM cells.

12. The semiconductor device of claim 11, wherein the read-port of the first SRAM cell is a first read-port of the first SRAM cell, the first SRAM cell further comprising:

a second read-port, wherein the second read-port includes a PG transistor, wherein the PG transistor in the second read-port is a p-type transistor.

13. The semiconductor device of claim 12, wherein the PG transistor in the second read-port includes a channel region disposed on the first active region.

14. The semiconductor device of claim 11, wherein, inside the first SRAM cell:

the PU transistor of the write-port and the PD transistor of the write-port share a first gate structure, the PG transistor of the write-port includes a second gate structure, and the gate structure of the PG transistor of the read-port is disposed on an extension line of the second gate structure.

15. The semiconductor device of claim 14, further comprising:

a gate-cut feature disposed between the second gate structure and the gate structure of the PG transistor of the read-port and isolating the second gate structure from the gate structure of the PG transistor of the read-port.

16. The semiconductor device of claim 11, wherein, inside the first SRAM cell, the PU transistor and the PD transistor of the write-port are a first PU transistor and a first PD transistor of the write-port, respectively, wherein the write-port further includes a second PU transistor and a second PD transistor, the second PU transistor includes a channel region disposed on the first active region, and the second PD transistor includes a channel region disposed on the second active region.

17. A memory array, comprising:

a first static random-access memory (SRAM) cell, wherein the first SRAM cell includes a write-port and a read-port, the read-port of the first SRAM cell includes a first pass-gate (PG) transistor of a first conductivity type, the write-port of the first SRAM cell includes a first pull-up (PU) transistor of the first conductive type, and the first PG transistor and the first PU transistor share a same active region; and a second SRAM cell, wherein the second SRAM cell includes a write-port and a read-port, the read-port of the second SRAM cell includes a second PG transistor of the first conductivity type, the write-port of the second SRAM cell includes a second PU transistor of the first conductivity type, and the second PG transistor and the second PU transistor share a same active region, wherein the write-port of the first SRAM cell includes a third PG transistor of a second conductivity type opposite to the first conductivity type, and the write-port of the second SRAM cell includes a fourth PG transistor of the second conductivity type, wherein the first PG transistor and the second PG transistor share a first gate structure that extends across a boundary between the first SRAM cell and the second SRAM cell.

18. The memory array of claim 17, further comprising:

an isolation feature extending across the boundary between the first SRAM cell and the second SRAM cell, wherein the isolation feature extends from an end of a gate structure of the third PG transistor to an end of a gate structure of the fourth PG transistor.

19. The memory array of claim 17, wherein the first PG transistor and the second PG transistor are p-type transistors disposed on an n-well, and the n-well extends through the boundary between the first SRAM cell and the second SRAM cell.

20. The memory array of claim 17, wherein:

the read-port of the first SRAM cell is a first read-port of the first SRAM cell, the read-port of the second SRAM cell is a first read-port of the second SRAM cell, the first SRAM cell includes a second read-port including a third PG transistor, the second SRAM cell includes a second read-port including a fourth PG transistor, and the third PG transistor and the fourth PG transistor share a second gate structure that extends across the boundary between the first SRAM cell and the second SRAM cell.

* * * * *